(12) United States Patent
Taniguchi

(10) Patent No.: US 12,081,757 B2
(45) Date of Patent: Sep. 3, 2024

(54) INFORMATION PROCESSING DEVICE, IMAGING DEVICE, INFORMATION PROCESSING METHOD, AND PROGRAM

(71) Applicant: Sony Group Corporation, Tokyo (JP)

(72) Inventor: Daisuke Taniguchi, Tokyo (JP)

(73) Assignee: Sony Group Corporation, Tokyo (JP)

( * ) Notice: Subject to any disclaimer, the term of this patent is extended or adjusted under 35 U.S.C. 154(b) by 276 days.

(21) Appl. No.: 17/611,786

(22) PCT Filed: Jun. 8, 2020

(86) PCT No.: PCT/JP2020/022484
§ 371 (c)(1),
(2) Date: Nov. 16, 2021

(87) PCT Pub. No.: WO2020/255768
PCT Pub. Date: Dec. 24, 2020

(65) Prior Publication Data
US 2022/0239914 A1    Jul. 28, 2022

(30) Foreign Application Priority Data

Jun. 20, 2019   (JP) .................................. 2019-114831

(51) Int. Cl.
*H04N 19/124*   (2014.01)
*H04N 19/184*   (2014.01)
*H04N 25/60*    (2023.01)

(52) U.S. Cl.
CPC ......... *H04N 19/124* (2014.11); *H04N 19/184* (2014.11); *H04N 25/60* (2023.01)

(58) Field of Classification Search
None
See application file for complete search history.

(56) References Cited

U.S. PATENT DOCUMENTS

| 2006/0176199 | A1* | 8/2006 | Nishide ................. H04N 19/85 375/E7.161 |
| 2016/0212348 | A1 | 4/2016 | Tatsumi |
| 2018/0108115 | A1 | 4/2018 | Tatsumi |

FOREIGN PATENT DOCUMENTS

| JP | 2006-222479 A | 8/2006 |
| JP | 4192900 B2 | 12/2008 |
| JP | 2016-136374 A | 7/2016 |

OTHER PUBLICATIONS

International Search Report issued on Sep. 15, 2020 in PCT/JP2020/022484 filed Jun. 8, 2020, 2 page.

* cited by examiner

*Primary Examiner* — Xiaolan Xu
(74) *Attorney, Agent, or Firm* — Oblon, McClelland, Maier & Neustadt, L.L.P.

(57) ABSTRACT

The present technology relates to an information processing device, an imaging device, an information processing method, and a program capable of generating an appropriate digital signal having high quantization precision from a digital signal having low quantization precision.
High-precision component information is extracted from an unprocessed signal that is a digital signal not subjected to predetermined signal processing and having first quantization precision, and a reproduction signal in which quantization precision of a processed signal obtained by performing the predetermined signal processing on the unprocessed signal is reproduced to the first quantization precision on the basis of the high-precision component information is generated. The present technology is applicable to, for example, an imaging device.

18 Claims, 31 Drawing Sheets

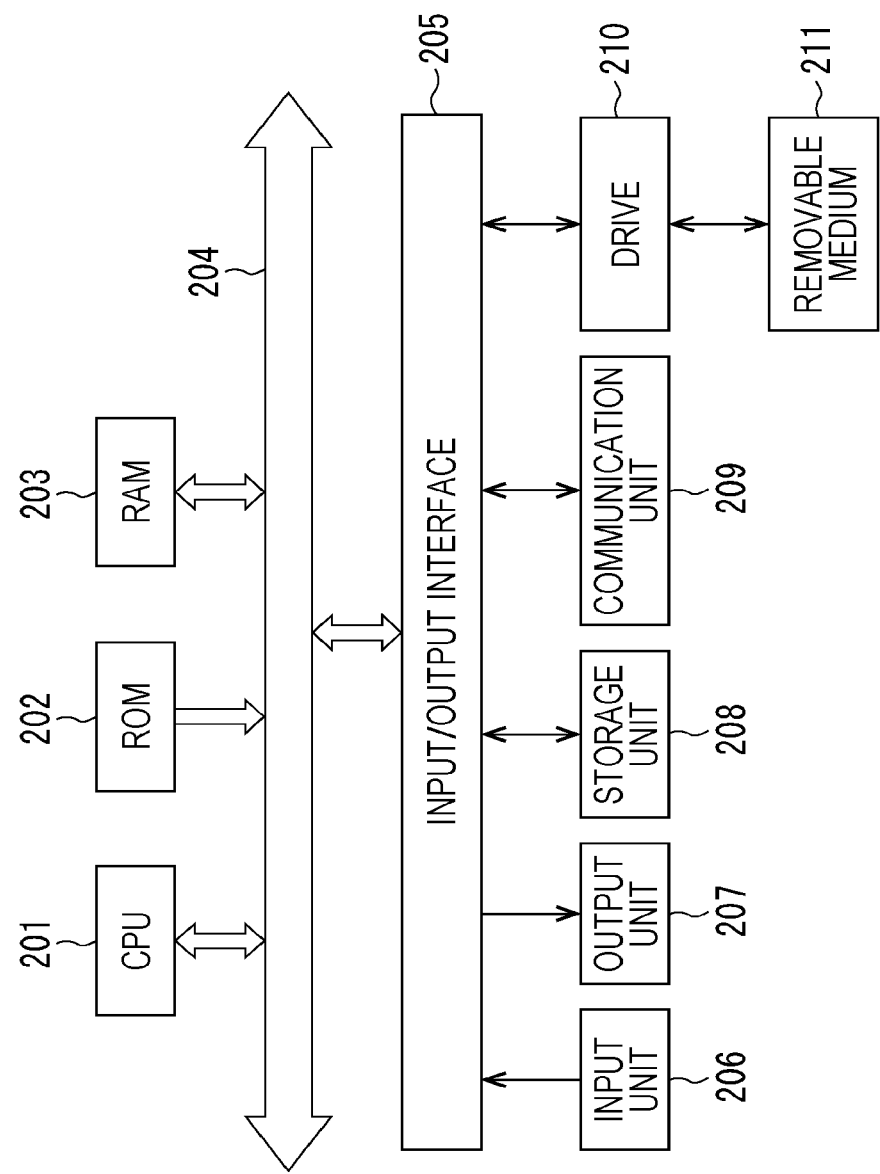

INFORMATION PROCESSING DEVICE, IMAGING DEVICE, INFORMATION PROCESSING METHOD, AND PROGRAM

TECHNICAL FIELD

The present technology relates to an information processing device, an imaging device, an information processing method, and a program, and particularly relates to an information processing device, an imaging device, an information processing method, and a program that reproduce quantization precision of a digital signal.

BACKGROUND ART

Patent Document 1 discloses a technology of generating a digital signal having high quantization precision (quantization bit depth) from a digital signal having low quantization precision.

CITATION LIST

Patent Document

Patent Document 1: Japanese Patent No. 4192900

SUMMARY OF THE INVENTION

Problems to be Solved by the Invention

However, in Patent Document 1, an appropriate digital signal having high quantization precision is not always obtained from a digital signal having low quantization precision.

The present technology has been made in view of such a circumstance, and, in particular, an object thereof is to generate an appropriate digital signal having high quantization precision from a digital signal having low quantization precision.

Solutions to Problems

An information processing device according to a first aspect of the present technology is an information processing device including: a high-precision component extraction unit that acquires, as an unprocessed signal, a digital signal not subjected to predetermined signal processing and having first quantization precision and extracts, from the unprocessed signal, high-precision component information regarding signal components included in the unprocessed signal; and a quantization precision reproduction unit that acquires, as a processed signal, a digital signal obtained by performing the predetermined signal processing on the unprocessed signal and having second quantization precision reduced from the first quantization precision and generates a reproduction signal in which the quantization precision of the processed signal is reproduced to the first quantization precision on the basis of the high-precision component information extracted by the high-precision component extraction unit.

In the information processing device according to the first aspect of the present technology, a digital signal not subjected to predetermined signal processing and having first quantization precision is acquired as an unprocessed signal, and high-precision component information regarding signal components included in the unprocessed signal is extracted from the unprocessed signal. Then, a digital signal obtained by performing the predetermined signal processing on the unprocessed signal and having second quantization precision reduced from the first quantization precision is acquired as a processed signal, and a reproduction signal in which the quantization precision of the processed signal is reproduced to the first quantization precision on the basis of the high-precision component information is generated.

An imaging device according to the present technology is an imaging device including: an image sensor unit that photoelectrically converts an optical image of a subject and outputs a digital signal of an image signal indicating the optical image; a high-precision component extraction unit that acquires, as an unprocessed signal, the digital signal output from the image sensor unit, not subjected to predetermined signal processing, and having first quantization precision and extracts, from the unprocessed signal, high-precision component information regarding signal components included in the unprocessed signal; and a quantization precision reproduction unit that acquires, as a processed signal, a digital signal obtained by performing the predetermined signal processing on the unprocessed signal and having second quantization precision reduced from the first quantization precision and generates a reproduction signal in which the quantization precision of the processed signal is reproduced to the first quantization precision on the basis of the high-precision component information extracted by the high-precision component extraction unit.

In the imaging device according to the present technology, an optical image of a subject is photoelectrically converted to output a digital signal of an image signal indicating the optical image, then the digital signal not subjected to predetermined signal processing and having first quantization precision is acquired as an unprocessed signal, and high-precision component information regarding signal components included in the unprocessed signal is extracted from the unprocessed signal. A digital signal obtained by performing the predetermined signal processing on the unprocessed signal and having second quantization precision reduced from the first quantization precision is acquired as a processed signal, and a reproduction signal in which the quantization precision of the processed signal is reproduced to the first quantization precision on the basis of the high-precision component information is generated.

An information processing method according to a second aspect of the present technology is an information processing method, in which an information processing device includes a high-precision component extraction unit, and a recording unit, the high-precision component extraction unit acquires, as an unprocessed signal, a digital signal not subjected to predetermined signal processing and having first quantization precision and extracts, from the unprocessed signal, high-precision component information regarding signal components included in the unprocessed signal, and the recording unit records, as a processed signal, a digital signal obtained by performing the predetermined signal processing on the unprocessed signal and having second quantization precision reduced from the first quantization precision and also records the high-precision component information extracted by the high-precision component extraction unit.

In the information processing method according to the second aspect of the present technology, a digital signal not subjected to predetermined signal processing and having first quantization precision is acquired as an unprocessed signal, and high-precision component information regarding signal components included in the unprocessed signal is extracted from the unprocessed signal. Then, a digital signal obtained by performing the predetermined signal processing on the unprocessed signal and having second quantization precision reduced from the first quantization precision is recorded as a processed signal, and the high-precision component information is also recorded.

An information processing device according to a third aspect of the present technology is an information processing device including a quantization precision reproduction unit that, on the basis of high-precision component information regarding signal components included in an unprocessed signal that is an M bit length digital signal not subjected to predetermined signal processing, a processed signal that is an M-L bit length digital signal obtained by performing the predetermined signal processing on the unprocessed signal, and an M bit length high-precision digital signal generated from the processed signal, generates a reproduction signal that is an M bit length digital signal in which quantization precision of the processed signal is reproduced to an M bit length.

An information processing method according to the third aspect of the present technology is an information processing method, in which an information processing device includes a quantization precision reproduction unit, and, on the basis of high-precision component information regarding signal components included in an unprocessed signal that is an M bit length digital signal not subjected to predetermined signal processing, a processed signal that is an M-L bit length digital signal obtained by performing the predetermined signal processing on the unprocessed signal, and an M bit length high-precision digital signal generated from the processed signal, the quantization precision reproduction unit generates a reproduction signal that is an M bit length digital signal in which quantization precision of the processed signal is reproduced to an M bit length.

In the information processing device and information processing method according to the third aspect of the present technology, on the basis of high-precision component information regarding signal components included in an unprocessed signal that is an M bit length digital signal not subjected to predetermined signal processing, a processed signal that is an M-L bit length digital signal obtained by performing the predetermined signal processing on the unprocessed signal, and an M bit length high-precision digital signal generated from the processed signal, a reproduction signal that is an M bit length digital signal in which quantization precision of the processed signal is reproduced to an M bit length is generated.

BRIEF DESCRIPTION OF DRAWINGS

FIG. 31 is a block diagram illustrating a configuration example of hardware of a computer that executes a series of processing by a program.

MODE FOR CARRYING OUT THE INVENTION

Hereinafter, embodiments of the present technology will be described with reference to the drawings.

<< Information Processing Device to which Present Technology Is Applied>>

Figure 1:
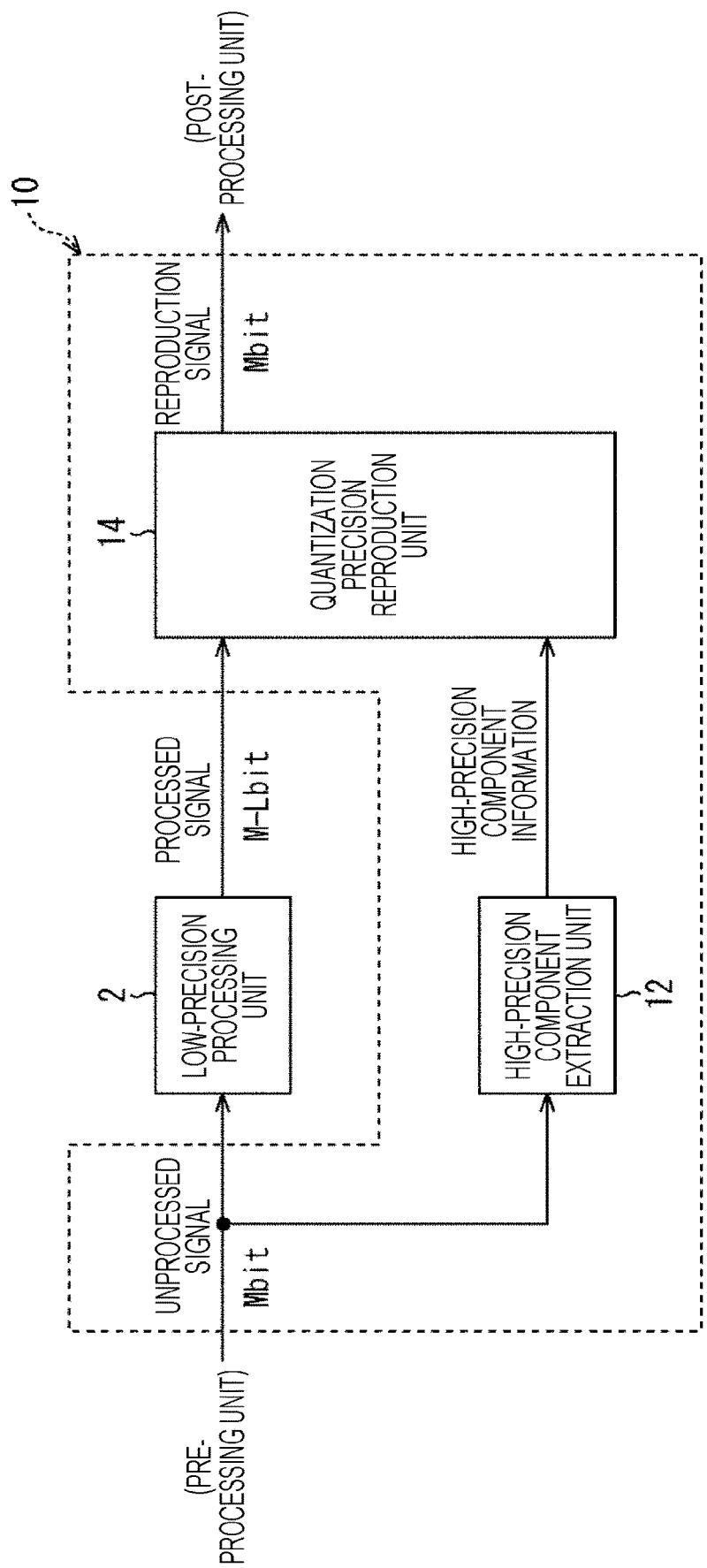
FIG. 1 is a block diagram illustrating a configuration example of a first embodiment of an information processing device to which the present technology is applied.

FIG. 1 is a block diagram illustrating a configuration example of a first embodiment of an information processing device to which the present technology is applied.

In FIG. 1, a low-precision processing unit 2 performs predetermined signal processing on a digital signal (unprocessed signal) having first quantization precision supplied from a pre-processing unit (not illustrated) and outputs a digital signal (processed signal) having second quantization precision lower than the first quantization precision as a result of the signal processing. The processing performed by the low-precision processing unit 2 is not limited to a specific type of processing.

Further, the quantization precision of the digital signal is represented by a quantization bit depth of the digital signal, and the quantization precision increases as the quantization bit depth of the digital signal increases, whereas the quantization precision decreases as the quantization bit depth of the digital signal decreases.

Herein, the quantization bit depth of the unprocessed signal to be supplied to the low-precision processing unit 2 is set to M bits (M represents an integer of 2 or more), and the quantization bit depth of the processed signal to be output from the low-precision processing unit 2 is set to M-L bits (L represents an integer of 1 or more and less than M). Further, the quantization bit depth will be referred to as "bit length", and, for example, a digital signal having the quantization bit depth of M bits will be referred to as "M bit length digital signal".

<Information Processing Device 10>

An information processing device 10 is provided so as to acquire the unprocessed signal to be supplied to the low-precision processing unit 2 and the processed signal to be output from the low-precision processing unit 2.

The information processing device 10 includes a high-precision component extraction unit 12 and a quantization precision reproduction unit 14. Note that the low-precision processing unit 2 may also be a component of the information processing device 10.

<High-Precision Component Extraction Unit 12>

The high-precision component extraction unit 12 acquires the same signal as the M bit length unprocessed signal supplied from the pre-processing unit to the low-precision processing unit 2. The high-precision component extraction unit 12 may acquire the unprocessed signal through a supply path branching off from a supply path of the unprocessed signal from the pre-processing unit to the low-precision processing unit 2 or may directly acquire the same signal as the unprocessed signal from the pre-processing unit.

The high-precision component extraction unit 12 extracts high-precision component information from the acquired unprocessed signal and supplies the extracted high-precision component information to the quantization precision reproduction unit 14.

The high-precision component information refers to information regarding a signal component included in the unprocessed signal, in other words, information regarding a waveform of the unprocessed signal. More specifically, the high-precision component information refers to information regarding a signal component that appears in the unprocessed signal having first quantization precision (M bit length) because data of least significant L bits that disappears in the digital signal having the second quantization precision (M-L bit length) exists.

<Quantization Precision Reproduction Unit 14>

The quantization precision reproduction unit 14 acquires the M-L bit length processed signal output from the low-precision processing unit 2. Then, the quantization precision reproduction unit 14 generates a digital signal (reproduction signal) in which the quantization precision of the processed signal supplied from the low-precision processing unit 2 is reproduced from the M-L bit length to the M bit length on the basis of the high-precision component information supplied from the high-precision component extraction unit 12.

The quantization precision reproduction unit 14 supplies the generated M bit length reproduction signal to a post-processing unit (not illustrated).

The information processing device 10 of FIG. 1 can acquire the high-precision component information from the unprocessed signal not processed yet in the low-precision processing unit 2 and having high quantization precision and use the high-precision component information in the quantization precision reproduction unit 14, thereby enabling high-precision quantization precision reproduction (reduction in quantization error) that cannot be conventionally realized.

That is, by using the high-precision component information, the information processing device 10 can not only increase the quantization precision of the processed signal but also generate an appropriate reproduction signal having a reduced quantization error. In other words, an M bit length processed signal, which is generated on the assumption that the quantization precision is not reduced in the low-precision processing unit 2, is generated as the reproduction signal.

<<Information Processing Procedure>>

Figure 2:
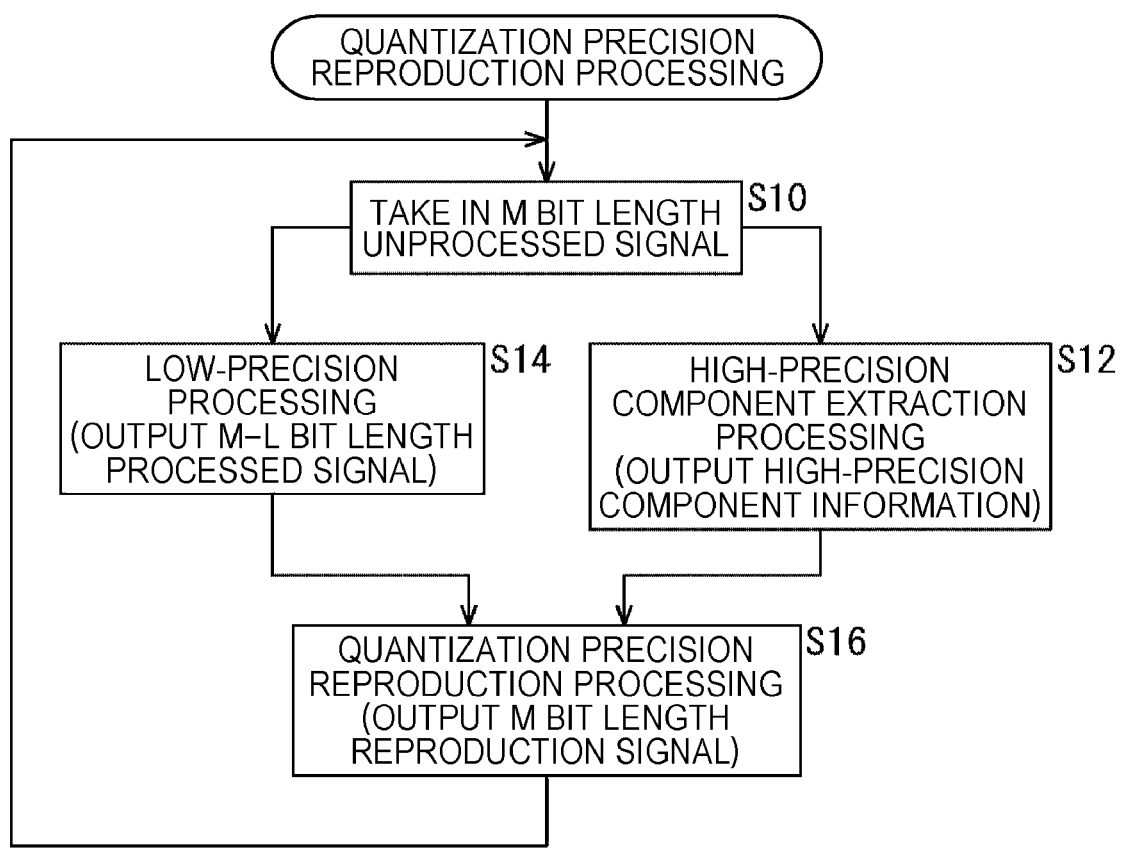
FIG. 2 is a flowchart showing an example of processing performed by a low-precision processing unit and an information processing device.

FIG. 2 is a flowchart showing an example of processing performed by the low-precision processing unit 2 and the information processing device 10 of FIG. 1.

In step S10, the low-precision processing unit 2 and the high-precision component extraction unit 12 take in an M bit length unprocessed signal from the pre-processing unit. The processing proceeds from step S10 to steps S12 and S14.

In step S12, the high-precision component extraction unit 12 extracts high-precision component information from the unprocessed signal taken in in step S10. The high-precision component extraction unit 12 supplies the extracted high-precision component information to the quantization precision reproduction unit 14. The processing proceeds from step S12 to step S16.

Meanwhile, in step S14, the low-precision processing unit 2 performs predetermined signal processing on the unprocessed signal taken in in step S10 and supplies an M-L bit length processed signal to the quantization precision reproduction unit 14. The processing proceeds from step S14 to step S16.

In step S16, the quantization precision reproduction unit 14 generates a reproduction signal in which the quantization precision of the M-L bit length processed signal supplied from the low-precision processing unit 2 in step S14 is reproduced (restored) to the M bit length on the basis of the high-precision component information supplied from the high-precision component extraction unit 12 in step S12. Then, the quantization precision reproduction unit 14 supplies the generated M bit length reproduction signal to the post-processing unit. Thereafter, the processing returns from step S16 to step S10, and the processing in steps S10 to S16 is repeated.

<<Configuration Example of Imaging Device to Which Present Technology is Applicable>>

Figure 3:
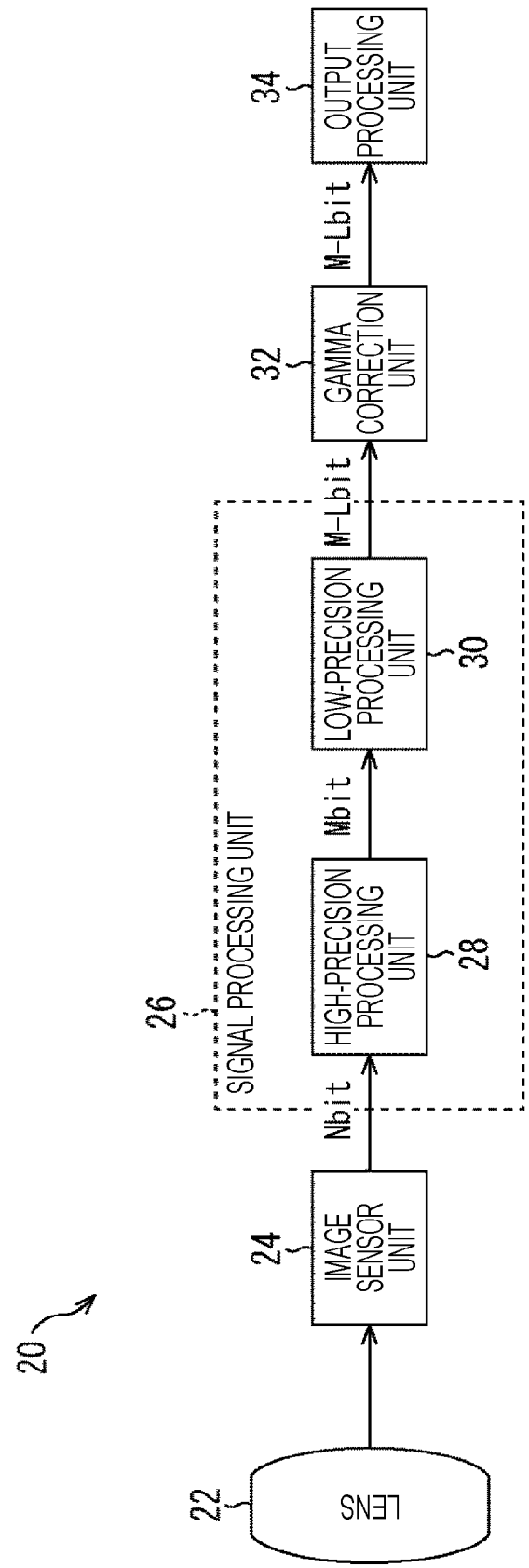
FIG. 3 is a block diagram illustrating a configuration example of an imaging device to which the present technology is applicable.

FIG. 3 is a block diagram illustrating a configuration example of an imaging device to which the present technology is applicable.

In FIG. 3, an imaging device 20 includes a lens 22, an image sensor unit 24, a signal processing unit 26, a gamma correction unit 32, and an output processing unit 34.

<Lens 22>

The lens 22 collects light entering the lens 22 on the image sensor unit 24 to form an optical image of a subject.

<Image Sensor Unit 24>

The image sensor unit 24 includes a solid-state imaging element (not illustrated) and causes the solid-state imaging element to photoelectrically convert the optical image of the subject formed by the lens 22, thereby generating an image signal indicating the optical image of the subject. Further, the image sensor unit 24 includes an A/D converter (not illustrated) and converts the image signal from an analog signal to an N bit length (N is an integer of 1 or more) digital signal. Then, the image sensor unit 24 supplies the image signal converted into the N bit length digital signal to the signal processing unit 26.

Note that the lens 22 and the image sensor unit 24 are not limited to specific configurations. The solid-state imaging element of the image sensor unit 24 may be a complementary metal oxide semiconductor (CMOS) image sensor or a charged coupled device (CCD) image sensor and is not limited to a specific type. Further, the image sensor unit 24 may include a single solid-state imaging element having an imaging surface provided with a color filter or may include, for example, a plurality of solid-state imaging elements for R, G, and B, respectively. Further, the image signal output from the image sensor unit 24 may be a moving image signal or a still image signal.

<Signal Processing Unit 26>

The signal processing unit 26 includes a high-precision processing unit 28 and a low-precision processing unit 30.

The high-precision processing unit 28 is a processing unit (circuit) having higher quantization precision than the low-precision processing unit 30. The quantization precision of the processing unit indicates the quantization precision (quantization bit depth) of a digital signal output by the processing unit.

The high-precision processing unit 28 has the quantization precision of an M bit length (M is an integer of N or more) with respect to the N bit length image signal supplied from the image sensor unit 24 and performs signal processing having the quantization precision of the M bit length on the image signal as high-quality processing.

Meanwhile, the low-precision processing unit 30 has lower quantization precision than the high-precision processing unit 28 and has the quantization precision of an M-L bit length (L is an integer of 1 or more and less than M). The low-precision processing unit 30 corresponds to the low-precision processing unit 2 of FIG. 1.

The high-precision processing unit 28 performs signal processing having the quantization precision of M bit length on the N bit length image signal supplied from the image sensor unit 24 and supplies the M bit length image signal to the low-precision processing unit 30 as a result of the signal processing.

The low-precision processing unit 30 performs predetermined signal processing on the M bit length image signal supplied from the high-precision processing unit 28 and supplies the M-L bit length image signal to the gamma correction unit 32 as a result of the signal processing.

Herein, the high-precision processing unit 28 performs basic signal processing (image processing) regarding characteristics of the image sensor unit 24, such as white balance adjustment, sensitivity adjustment, and color adjustment, for example.

Meanwhile, the low-precision processing unit 30 performs signal processing (image processing) that is not performed by the high-precision processing unit 28, such as resolution conversion, color conversion, noise reduction, and enhancement, for example. Note that the low-precision processing unit 30 performs the signal processing while prioritizing reduction of power consumption and acceleration of processing over quality. Further, the low-precision processing unit 30 can be provided as an external signal processing unit connected to the imaging device 20 via a cable or the like.

<Gamma Correction Unit 32>

The gamma correction unit 32 corrects a grayscale characteristic so that the M-L bit length image signal supplied from the low-precision processing unit 30 has an inverse characteristic of a gamma characteristic of an output device such as a monitor or printer. Then, the gamma correction unit 32 supplies the corrected M-L bit length image signal to the output processing unit 34.

<Output Processing Unit 34>

The output processing unit 34 converts the M-L bit length image signal supplied from the gamma correction unit 32 into an output signal in a final signal output format and supplies the converted output signal to the output device (not illustrated).

<Comparison with Imaging Device that Does Not Include Low-Precision Processing Unit 30>

Figure 4:
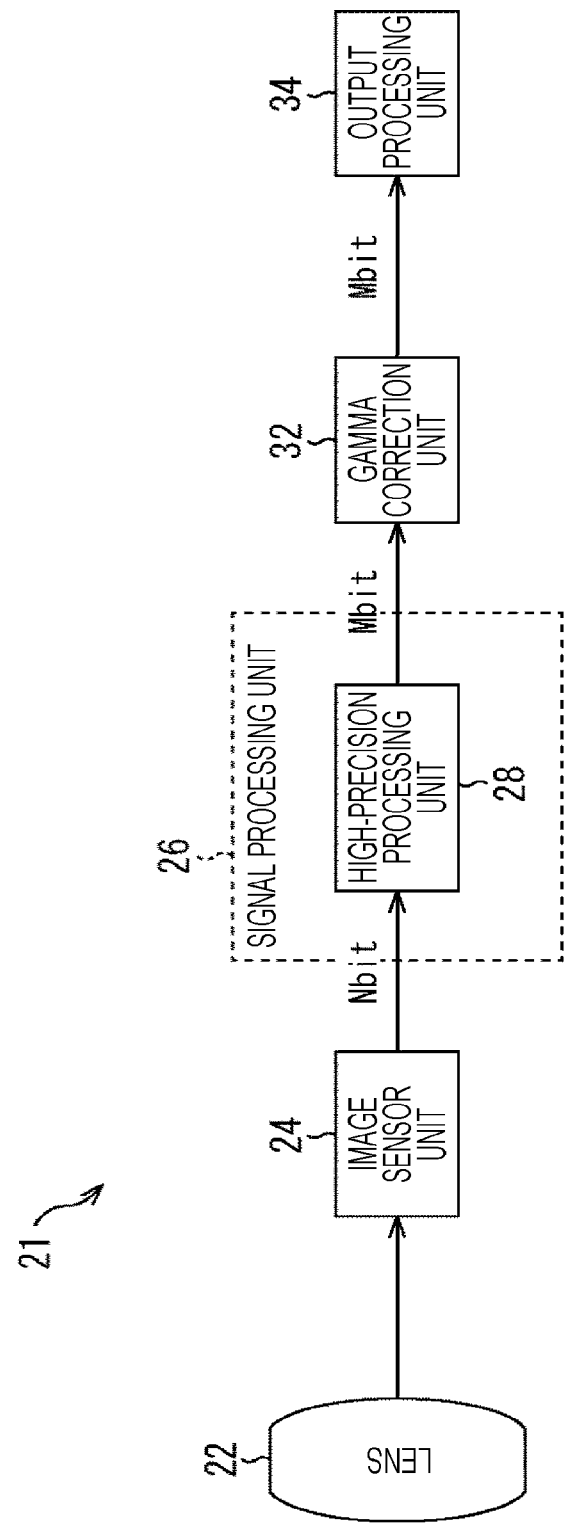
FIG. 4 is a block diagram illustrating a configuration example of an imaging device that does not include a low-precision processing unit.

Herein, FIG. 4 is a block diagram illustrating a configuration example of an imaging device 21 in which the signal processing unit 26 does not include the low-precision processing unit 30 in the imaging device 20 of FIG. 3. Note that, in FIG. 4, parts corresponding to the parts of the imaging device 20 in FIG. 3 are denoted by the same reference signs, and description thereof will be appropriately omitted.

As illustrated in FIG. 4, in a case where the signal processing unit 26 does not include the low-precision processing unit 30, the high-precision processing unit 28 further performs the signal processing in the low-precision processing unit 30, and an M bit length image signal is supplied from the signal processing unit 26 to the gamma correction unit 32.

Then, the gamma correction unit 32 performs gamma correction on the M bit length image signal supplied from the signal processing unit 26 and supplies the corrected M bit length image signal to the output processing unit 34.

The output processing unit 34 converts the M bit length image signal supplied from the gamma correction unit 32 into an output signal in a predetermined format and supplies the converted output signal to the output device.

In a case where the signal processing unit 26 does not include the low-precision processing unit 30 as in the imaging device 21 of FIG. 4, the output processing unit 34 generates an output signal to be supplied to the output device on the basis of the M bit length image signal.

Meanwhile, in a case where the signal processing unit 26 includes the low-precision processing unit 30 as in the imaging device 20 of FIG. 3, the output processing unit 34 generates an output signal to be supplied to the output device on the basis of the M-L bit length image signal. Therefore, in a case where the signal processing unit 26 includes the low-precision processing unit 30, reduction in the quantization precision of the image signal may adversely affect an output result of the output device (may reduce image quality), as compared with a case where the signal processing unit 26 does not include the low-precision processing unit 30.

For example, in a case where a signal is greatly amplified by gain adjustment or gamma correction, data of least significant bits is increased to most significant bits. As a result, a signal having an insufficient grayscale is obtained.

Therefore, in a case where the signal processing unit 26 includes the low-precision processing unit 30 as in the imaging device 20 of FIG. 3, the information processing device 10 of FIG. 1 is applicable to the imaging device 20. By applying the information processing device 10 to the imaging device 20, it is possible to reproduce the quantization precision of the M-L bit length image signal output from the low-precision processing unit 30 to the quantization precision of the M bit length. This makes it possible to reduce the adverse effect on the output result caused by the reduction in the quantization precision because of the low-precision processing unit 30.

<< First Configuration Example of Imaging Device to which Present Technology is Applied>>

Figure 5:
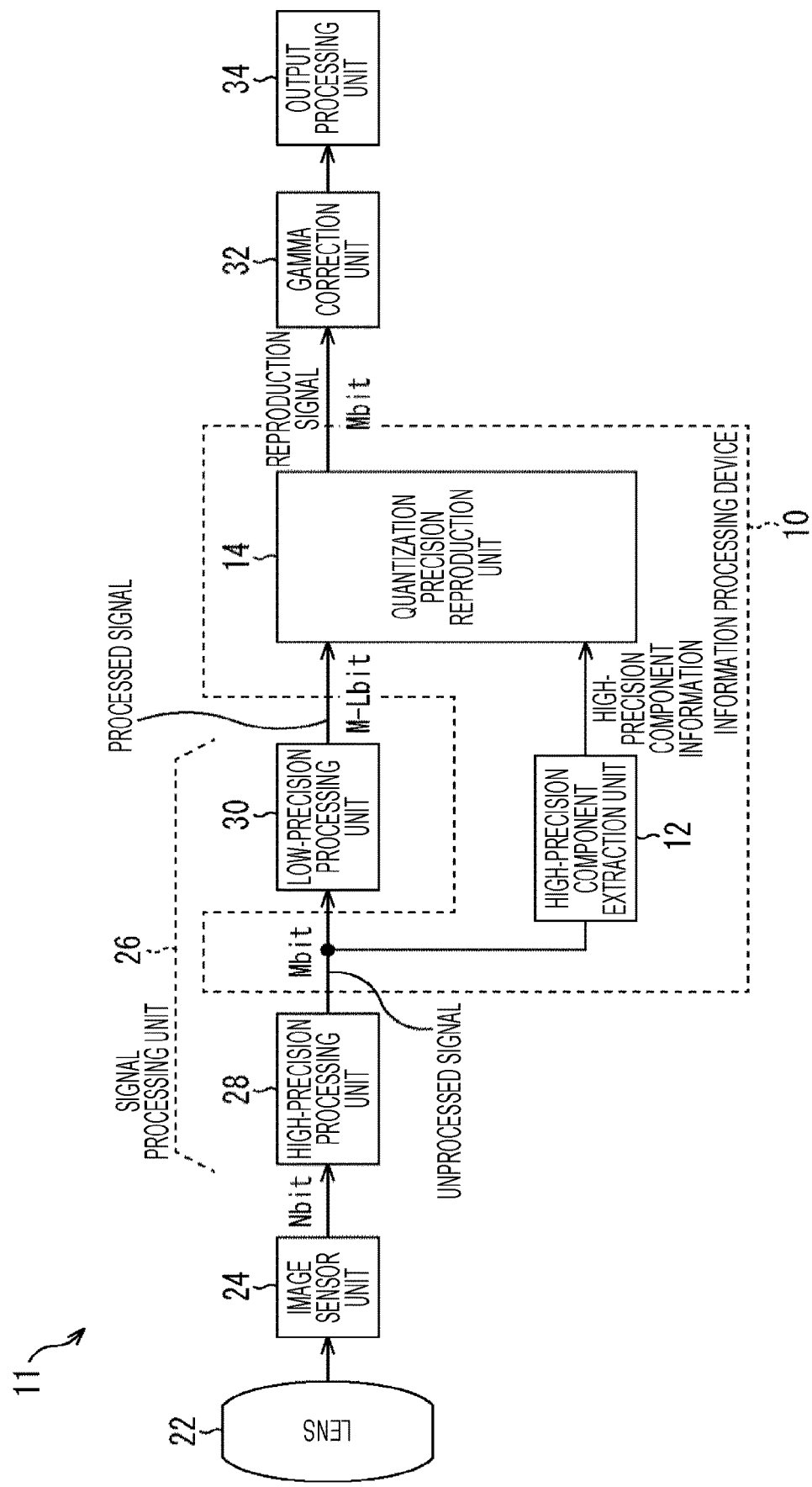
FIG. 5 is a block diagram illustrating a first configuration example of an imaging device to which the present technology is applied.

FIG. 5 is a block diagram illustrating a first configuration example of an imaging device to which the present technology is applied.

That is, FIG. 5 illustrates a configuration example of an imaging device 11 to which the information processing device 10 of FIG. 1 is applied to the imaging device 20 of FIG. 3.

Note that, in FIG. 5, parts corresponding to the parts of the information processing device 10 in FIG. 1 and the imaging device 20 in FIG. 3 are denoted by the same reference signs, and description thereof will be appropriately omitted.

In FIG. 5, the low-precision processing unit 30 in the signal processing unit 26 corresponds to the low-precision processing unit 2 of FIG. 1.

<High-Precision Component Extraction Unit 12>

The high-precision component extraction unit 12 of the information processing device 10 acquires an M bit length image signal supplied from the high-precision processing unit 28 to the low-precision processing unit 30 as an unprocessed signal.

Then, the high-precision component extraction unit 12 extracts high-precision component information from the acquired M bit length unprocessed signal and supplies the extracted high-precision component information to the quantization precision reproduction unit 14.

<Quantization Precision Reproduction Unit 14>

The quantization precision reproduction unit 14 acquires an M-L bit length image signal output from the low-precision processing unit 30 as a processed signal.

Then, the quantization precision reproduction unit 14 generates an image signal in which the quantization precision of the processed signal is reproduced from the M-L bit length to the M bit length on the basis of the high-precision component information supplied from the high-precision component extraction unit 12.

The quantization precision reproduction unit 14 supplies the generated M bit length image signal to the gamma correction unit 32 as a reproduction signal.

According to the imaging device 11 of FIG. 5, the M-L bit length image signal (processed signal) output from the low-precision processing unit 30 is formed into the M bit length image signal (reproduction signal) by the information processing device 10. That is, the reproduction signal having the same quantization precision as the unprocessed signal output from the high-precision processing unit 28 is restored. Therefore, even in a case where the imaging device 20 includes the low-precision processing unit 30, the adverse effects such as reduction in image quality in the output device are reduced.

Further, because the low-precision processing unit can be used as a part of a system, improvement in flexibility of system construction by a user and optimization of cost can be expected. Further, by using an existing low-precision processing unit instead of waiting for development of a new device or the like, it is possible to early operate the system or put the system on the market, thereby contributing to development of the industry.

<< Specific Configuration Example of Information processing device 10>>

Figure 6:
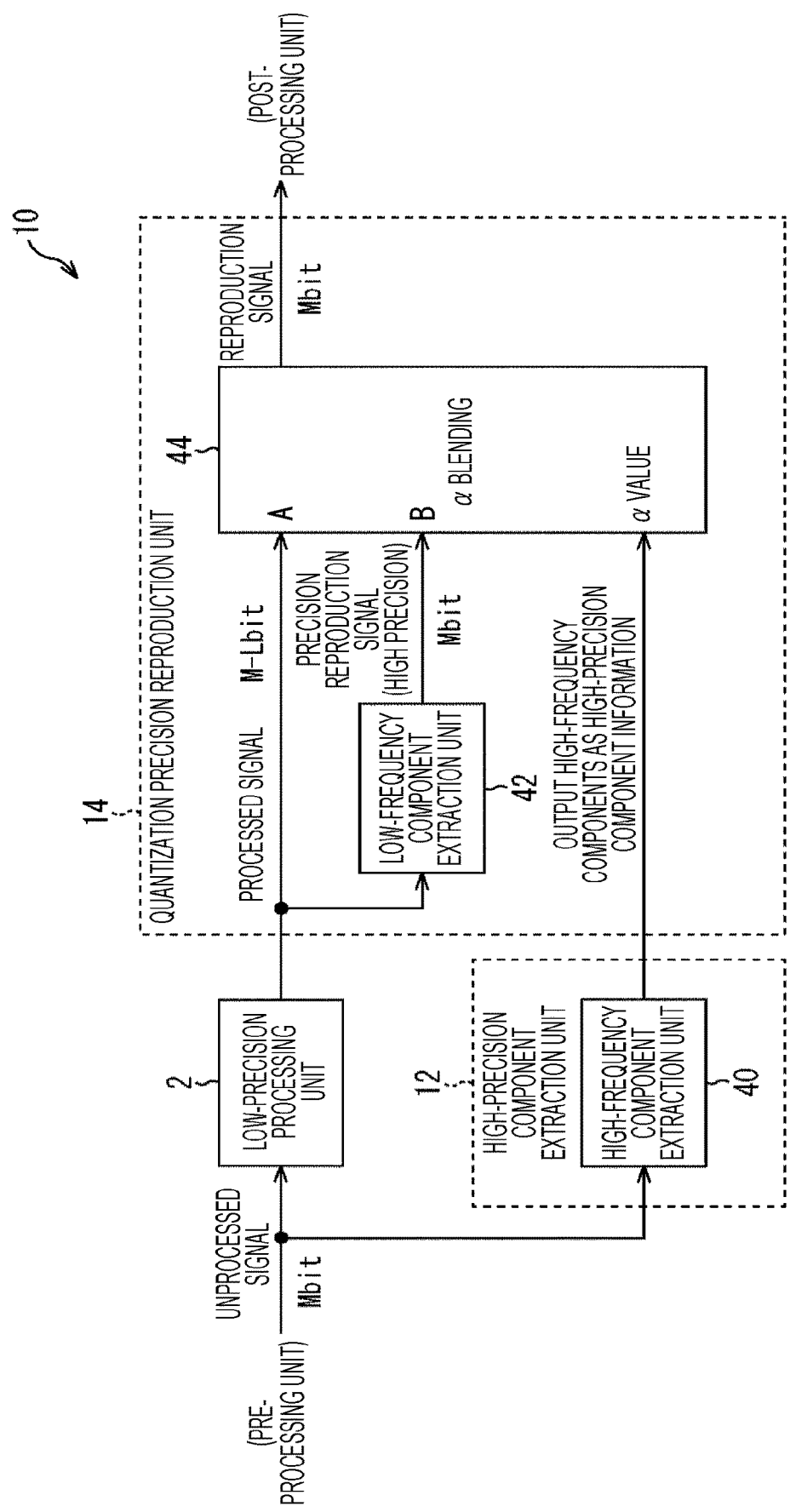
FIG. 6 is a block diagram illustrating a configuration example of a high-precision component extraction unit and a quantization precision reproduction unit of an information processing device.

FIG. 6 is a block diagram illustrating a configuration example of the high-precision component extraction unit 12 and the quantization precision reproduction unit 14 of the information processing device 10 in FIG. 1.

Note that the high-precision component extraction unit 12 and the quantization precision reproduction unit 14 in FIG. 5 are configured as in FIG. 6. Further, for example, an image signal output by the high-precision processing unit 28 of FIG. 5 is employed as an unprocessed signal having M bits.

<High-Precision Component Extraction Unit 12>

The high-precision component extraction unit 12 includes a high-frequency component extraction unit 40. The high-frequency component extraction unit 40 acquires an M bit length unprocessed signal to be supplied to the low-precision processing unit 2.

Then, the high-frequency component extraction unit 40 extracts high-frequency components from the acquired M bit length unprocessed signal and supplies the extracted high-frequency components to the quantization precision reproduction unit 14 as the high-precision component information.

<Quantization Precision Reproduction Unit 14>

The quantization precision reproduction unit 14 includes a low-frequency component extraction unit 42 and an α blending unit 44.

The low-frequency component extraction unit 42 acquires an M-L bit length processed signal supplied from the low-precision processing unit 2 to the quantization precision reproduction unit 14.

Then, the low-frequency component extraction unit 42 extracts low-frequency components from the acquired M-L bit length processed signal and supplies the extracted low-frequency components to the α blending unit 44 as an M bit length digital signal (precision reproduction signal). The M bit length precision reproduction signal is a high-precision digital signal generated from the processed signal and having high quantization precision.

Note that the low-frequency component extraction unit 42 generates the M bit length precision reproduction signal by adding L bits as least significant bits of the M-L bit length processed signal to generate an M bit length processed signal and performing processing of extracting low-frequency components from the M bit length processed signal. However, the low-frequency component extraction unit 42 may generate a processed signal having a quantization bit depth greater than the M bit length and perform the processing of extracting low-frequency components or may generate a precision reproduction signal having a quantization bit depth greater than the M bit length.

The α blending unit 44 takes in (a signal level of) the processed signal A supplied from the low-precision processing unit 2, (a signal level of) the precision reproduction signal B supplied from the low-frequency component extraction unit 42, and (a signal level of) the high-frequency components α supplied from the high-frequency component extraction unit 40.

Then, the α blending unit 44 calculates (generates) (a sample value of) a reproduction signal O by Expression (1) below in which the high-frequency components α serve as a blending coefficient (combination ratio) of α blending (combination).

$$O = A \cdot \alpha + B \cdot (1-\alpha) \quad (1)$$

According to Expression (1) described above, the α blending unit 44 outputs an M bit length reproduction signal having, as a sample value, the value O calculated for each sample value A of the processed signal.

Herein, the processed signal A has low quantization precision but contains a large number of high-frequency components. In a case where the unprocessed signal does not have a smooth gradation signal waveform, that is, in a case where the unprocessed signal contains a large number of high-frequency components, it is desirable to use a large number of processed signals A in order to calculate the reproduction signal O.

Meanwhile, the precision reproduction signal B is a signal in which the high-frequency components are attenuated. In a case where the unprocessed signal has a smooth gradation signal waveform, it is desirable to use a large number of precision reproduction signals B in order to calculate the reproduction signal O.

Therefore, in a case where the high-frequency components α of the unprocessed signal are small, that is, in a case where a change amount of the unprocessed signal is small, the α blending unit 44 increases a proportion of the precision reproduction signals B in the reproduction signal O and actively performs precision reproduction. Meanwhile, in a case where the high-frequency components α of the unprocessed signal are large, that is, in a case where the change amount of the unprocessed signal is large, the a blending unit 44 increases a proportion of the processed signals A in the reproduction signal O, thereby restraining deterioration of the reproduction signal O caused by attenuation of the high-frequency components.

<<Information Processing Procedure>>

Figure 7:
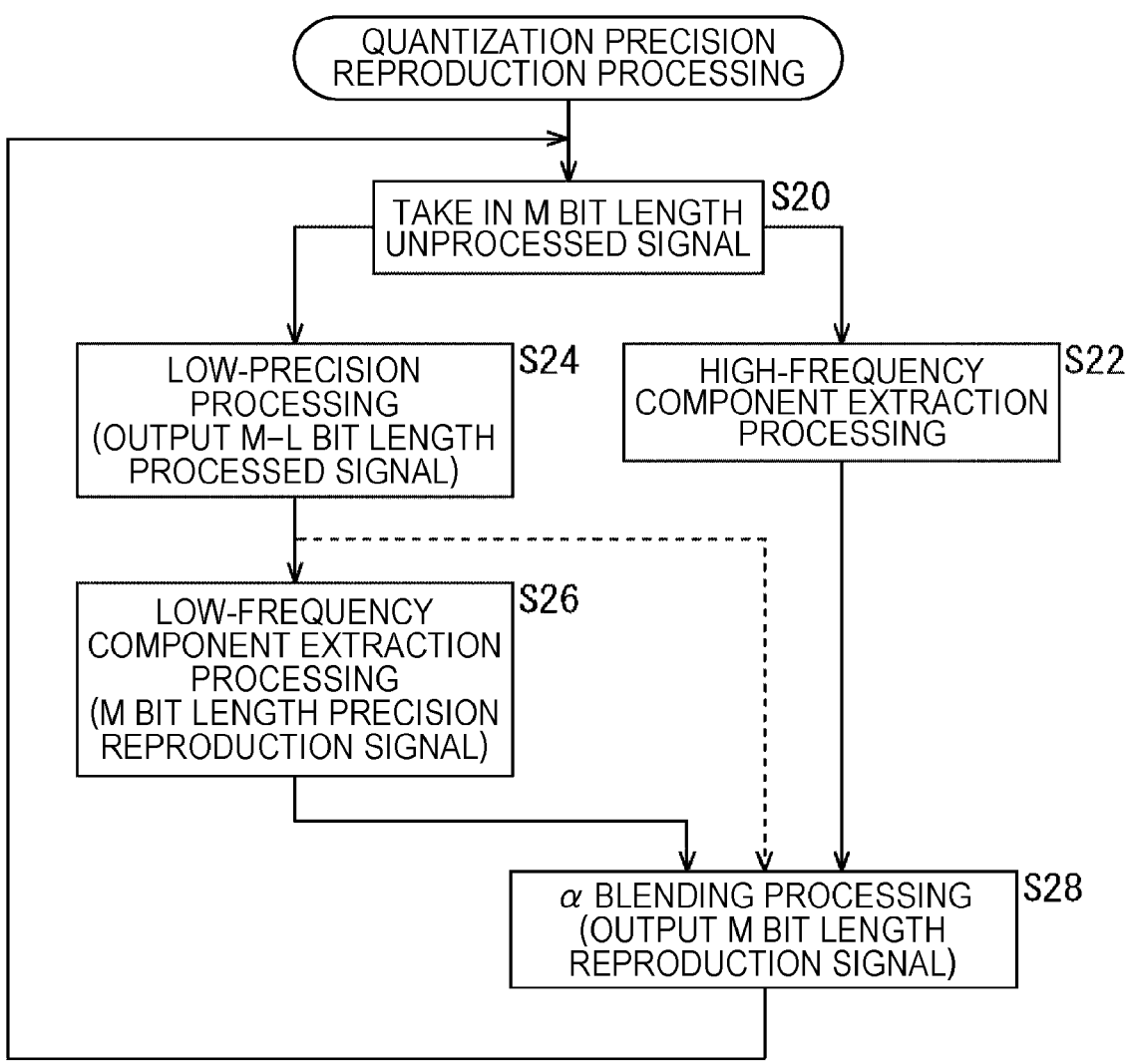
FIG. 7 is a flowchart showing an example of processing performed by a low-precision processing unit and the information processing device of FIG. 6.

FIG. 7 is a flowchart showing an example of processing performed by the low-precision processing unit 2 and the information processing device 10 of FIG. 6.

In step S20, the low-precision processing unit 2 and the high-frequency component extraction unit 40 take in an M bit length unprocessed signal from the pre-processing unit (e.g., the high-precision processing unit 28 in FIG. 5). The processing proceeds from step S20 to steps S22 and S24.

In step S22, the high-frequency component extraction unit 40 extracts high-frequency components from the unprocessed signal taken in in step S20. The high-frequency component extraction unit 40 supplies the extracted high-frequency components (high-precision component information) to the α blending unit 44 of the quantization precision reproduction unit 14. The processing proceeds from step S22 to step S28.

Meanwhile, in step S24, the low-precision processing unit 2 performs predetermined signal processing on the unprocessed signal taken in in step S20 and supplies an M-L bit length processed signal to the low-frequency component extraction unit 42 and the α blending unit 44 of the quantization precision reproduction unit 14. The processing proceeds from step S24 to step S26.

In step S26, the low-frequency component extraction unit 42 of the quantization precision reproduction unit 14 extracts M bit length low-frequency components from the M-L bit length processed signal supplied from the low-precision processing unit 2 in step S24. The low-frequency component extraction unit 42 supplies the extracted low-frequency components to the α blending unit 44 as an M bit length precision reproduction signal. The processing proceeds from step S26 to step S28.

In step S28, the a blending unit 44 of the quantization precision reproduction unit 14 calculates Expression (1) by using the high-frequency components α supplied from the high-frequency component extraction unit 40 in step S22, the M-L bit length processed signal A supplied from the low-precision processing unit 2 in step S24, and the precision reproduction signal B supplied from the low-frequency component extraction unit 42 in step S26, thereby calculating a reproduction signal O. Thus, the M bit length reproduction signal O is generated.

The α blending unit 44 supplies the generated M bit length reproduction signal O to the post-processing unit (e.g., the gamma correction unit 32 in FIG. 5). Then, the processing returns from step S28 to step S20, and the processing in steps S20 to S28 is repeated.

<< Details of Processing>>

Next, the processing in the high-precision component extraction unit 12 and the quantization precision reproduction unit 14 of the information processing device 10 in FIG. 6 will be described with reference to FIGS. 8 to 14.

In FIGS. 8 to 14, each horizontal axis represents time, and each vertical axis represents a signal level.

Figure 8:
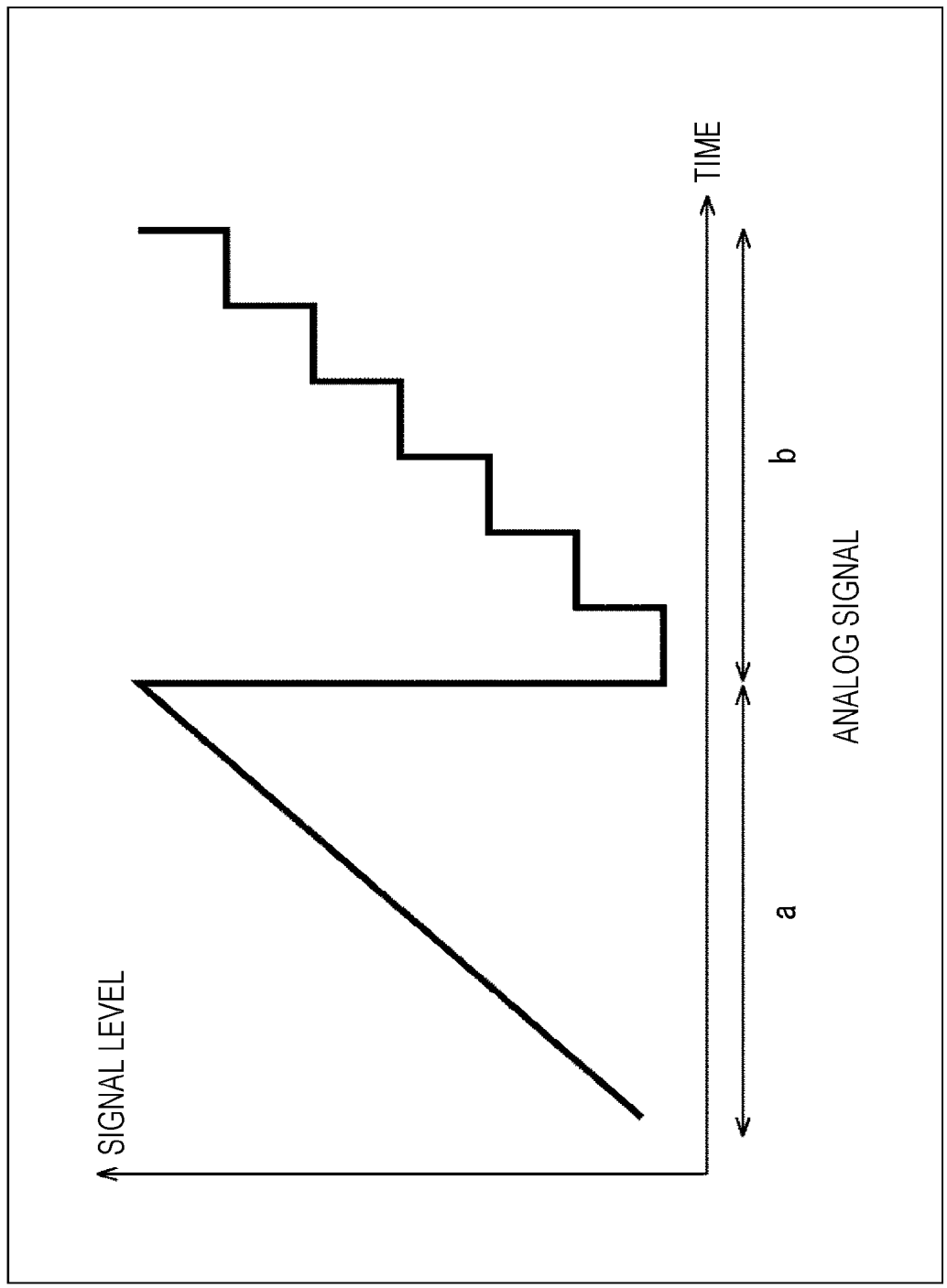
FIG. 8 illustrates details of processing performed by the information processing device of FIG. 6.

FIG. 8 illustrates an analog signal that has not yet been converted into a digital signal and serves as an unprocessed signal to be supplied to the low-precision processing unit 2. In the analog signal of FIG. 8, the signal level increases linearly in a period a and increases stepwise in a period b.

Figure 9:
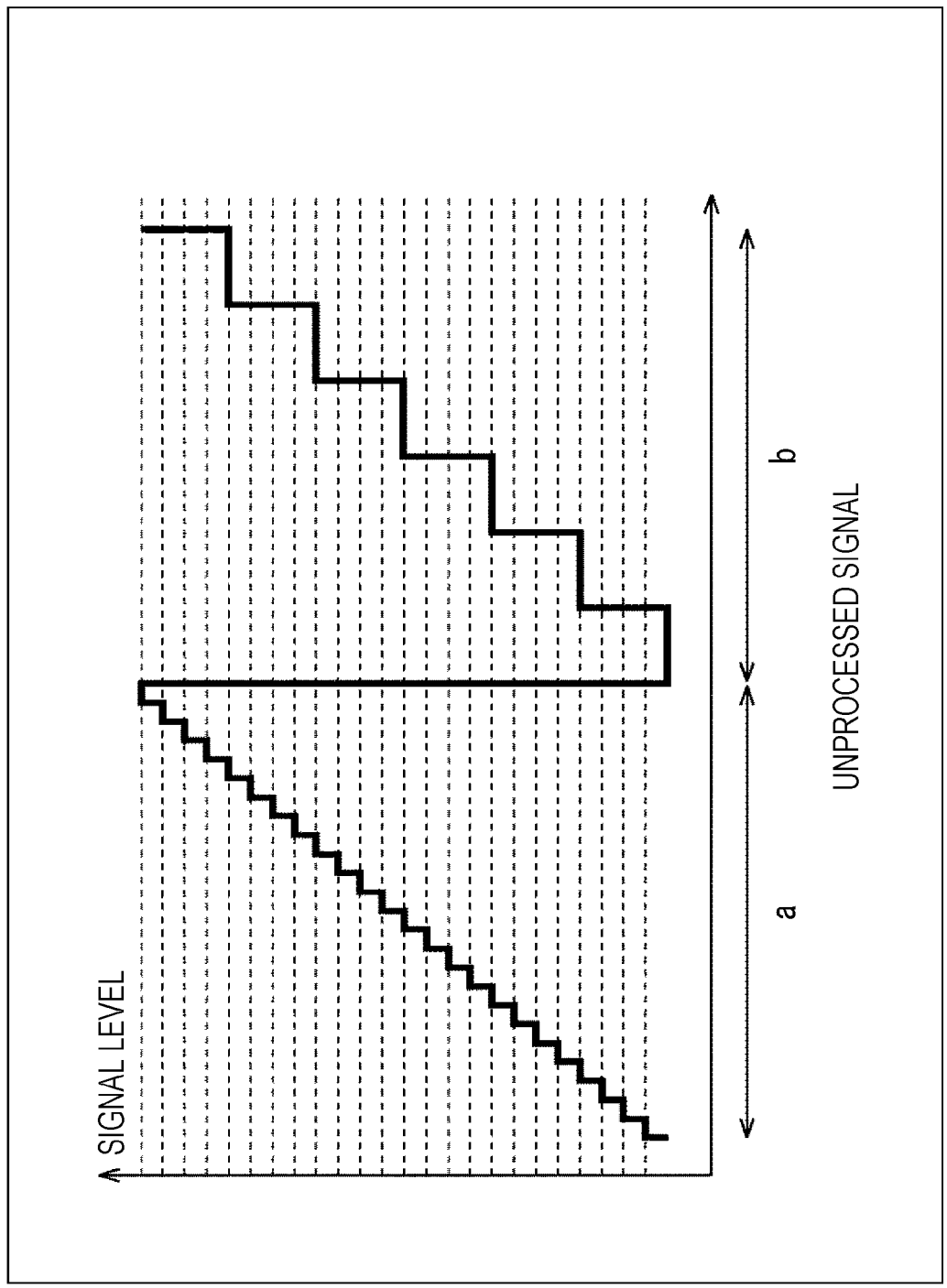
FIG. 9 illustrates details of processing performed by the information processing device of FIG. 6.

FIG. 9 illustrates the unprocessed signal serving as an M bit length digital signal into which the analog signal of FIG. 8 is converted. In FIG. 9, as well as in FIG. 8, there is a clear difference between a waveform in the period a and a waveform in the period b in the quantization precision of the M bit length.

Figure 10:
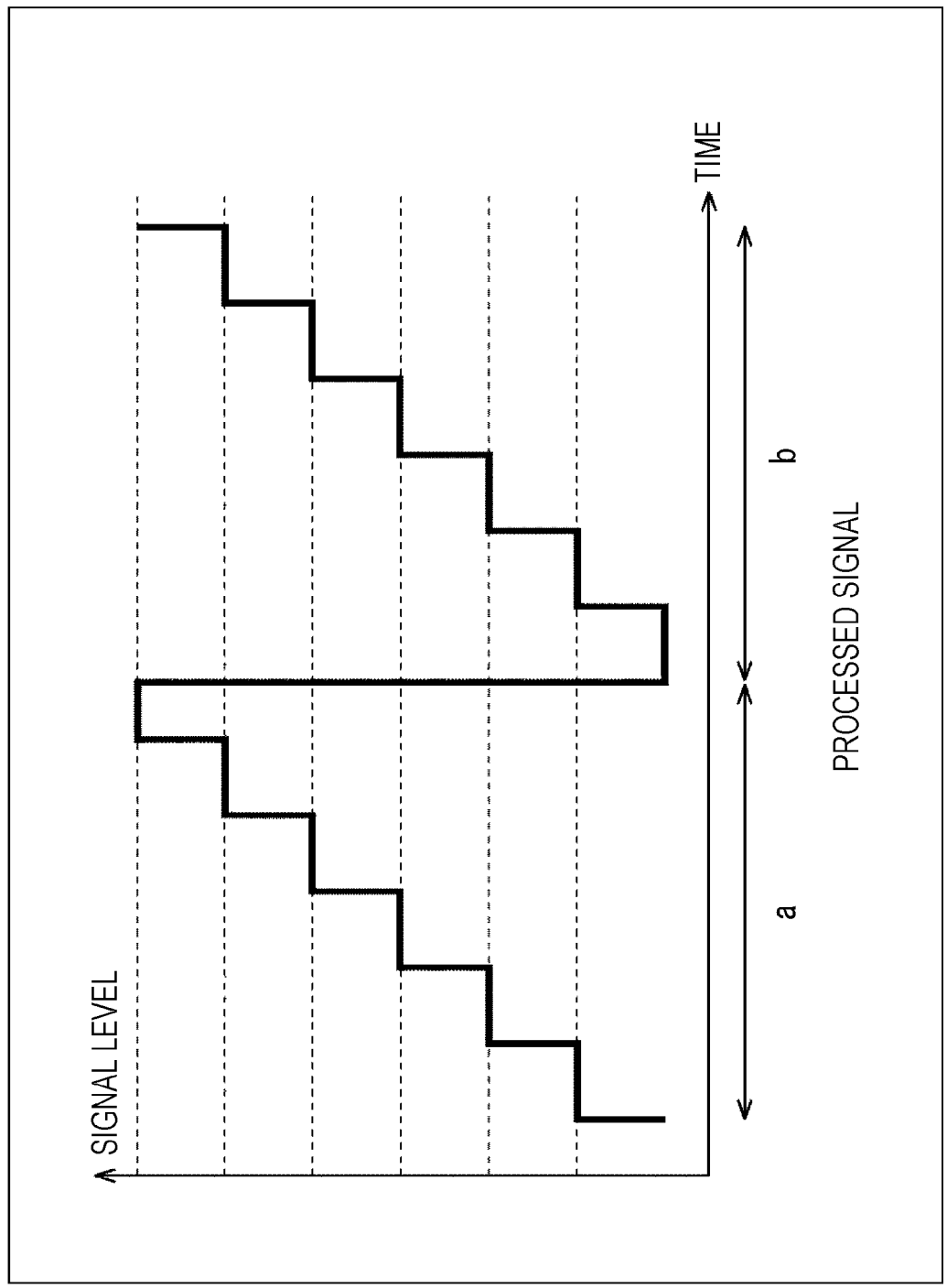
FIG. 10 illustrates details of processing performed by the information processing device of FIG. 6.

FIG. 10 illustrates an M-L bit length processed signal obtained by subjecting the unprocessed signal of FIG. 9 to the signal processing in the low-precision processing unit 2. Note that, in order to simplify the description, it is assumed that there is no change in the waveforms due to the signal processing performed by the low-precision processing unit 2. In FIG. 10, both the waveform in the period a and the waveform in the period b of the processed signal are stepwise waveforms due to reduction in the quantization precision from the M bit length to the M-L bit length. Thus, the difference between the waveform in the period a and the waveform in the period b is unclear.

Figure 11:
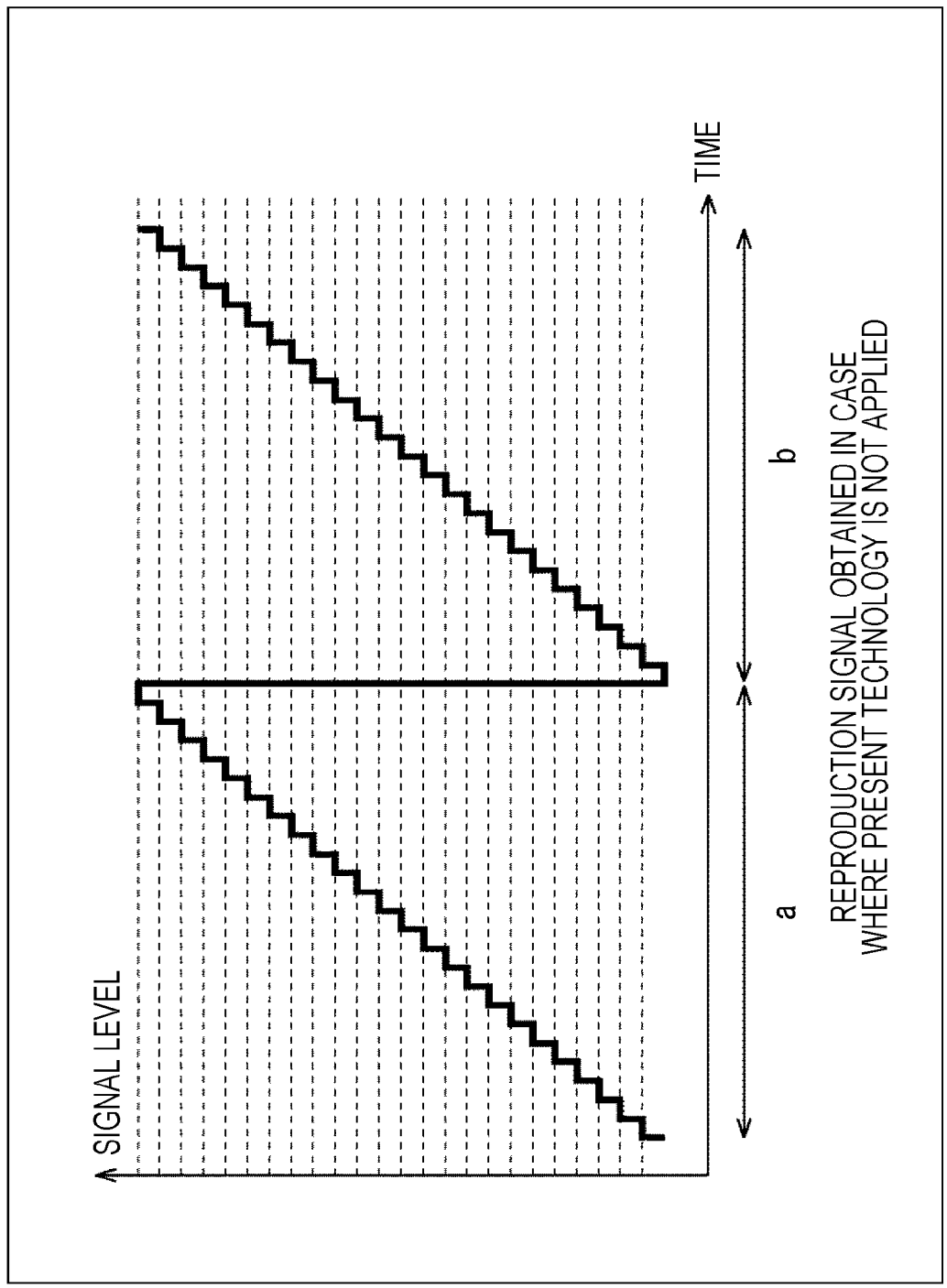
FIG. 11 illustrates details of processing performed by the information processing device of FIG. 6.

FIG. 11 illustrates a reproduction signal obtained in a case where the quantization precision of the processed signal in FIG. 10 is reproduced from the M-L bit length to the M bit length without applying the present technology. In FIG. 11, in a case where the present technology is not applied, the quantization precision is reproduced by, for example, linear interpolation only on the basis of information included in the processed signal of FIG. 10, and therefore substantially the same waveforms are reproduced (generated) in the period a and the period b as the reproduction signal of FIG. 11. The waveform in the period a and the waveform in the period b of the reproduction signal is supposed to be different as in the unprocessed signal of FIG. 9. Therefore, the reproduction signal of FIG. 11 is not appropriate. Further, although the quantization precision of the processed signal of FIG. 10 is increased from the M-L bit length to the M bit length, the reproduction signal of FIG. 11 is not an appropriate reproduction signal having a reduced quantization error.

Figure 12:
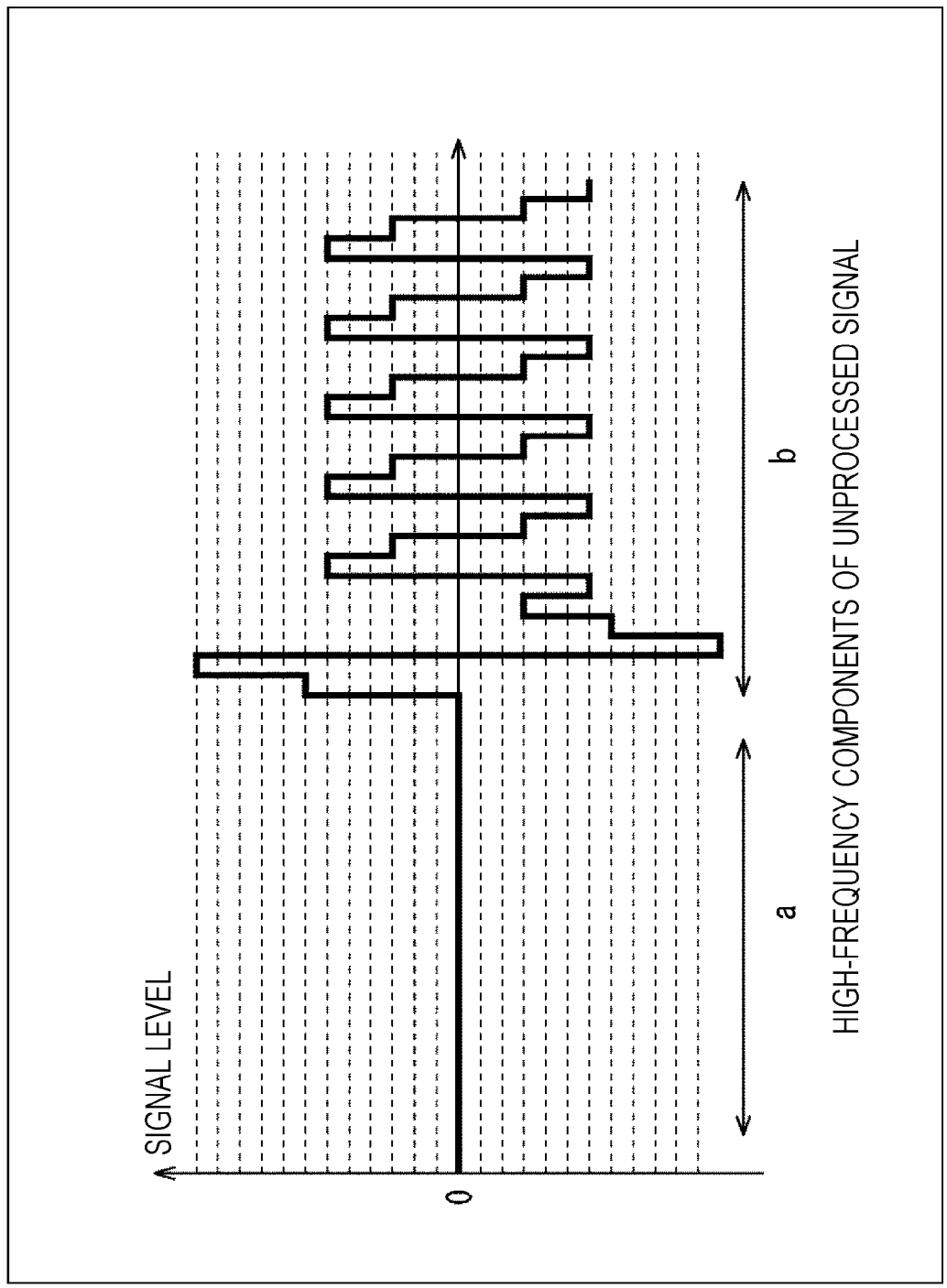
FIG. 12 illustrates details of processing performed by the information processing device of FIG. 6.

FIG. 12 illustrates high-frequency components extracted by the high-frequency component extraction unit 40 from the M bit length unprocessed signal of FIG. 9. According to the high-frequency components of FIG. 12, there is a small number of high-frequency components of the unprocessed signal of FIG. 9 in the period a, and therefore the signal level of the high-frequency components indicates a substantially constant value and a substantially zero value.

Meanwhile, there are a large number of high-frequency components in a stepwise part of the unprocessed signal of FIG. 9 in the period b of FIG. 12, and therefore the signal level of the high-frequency components greatly fluctuates.

Figure 13:
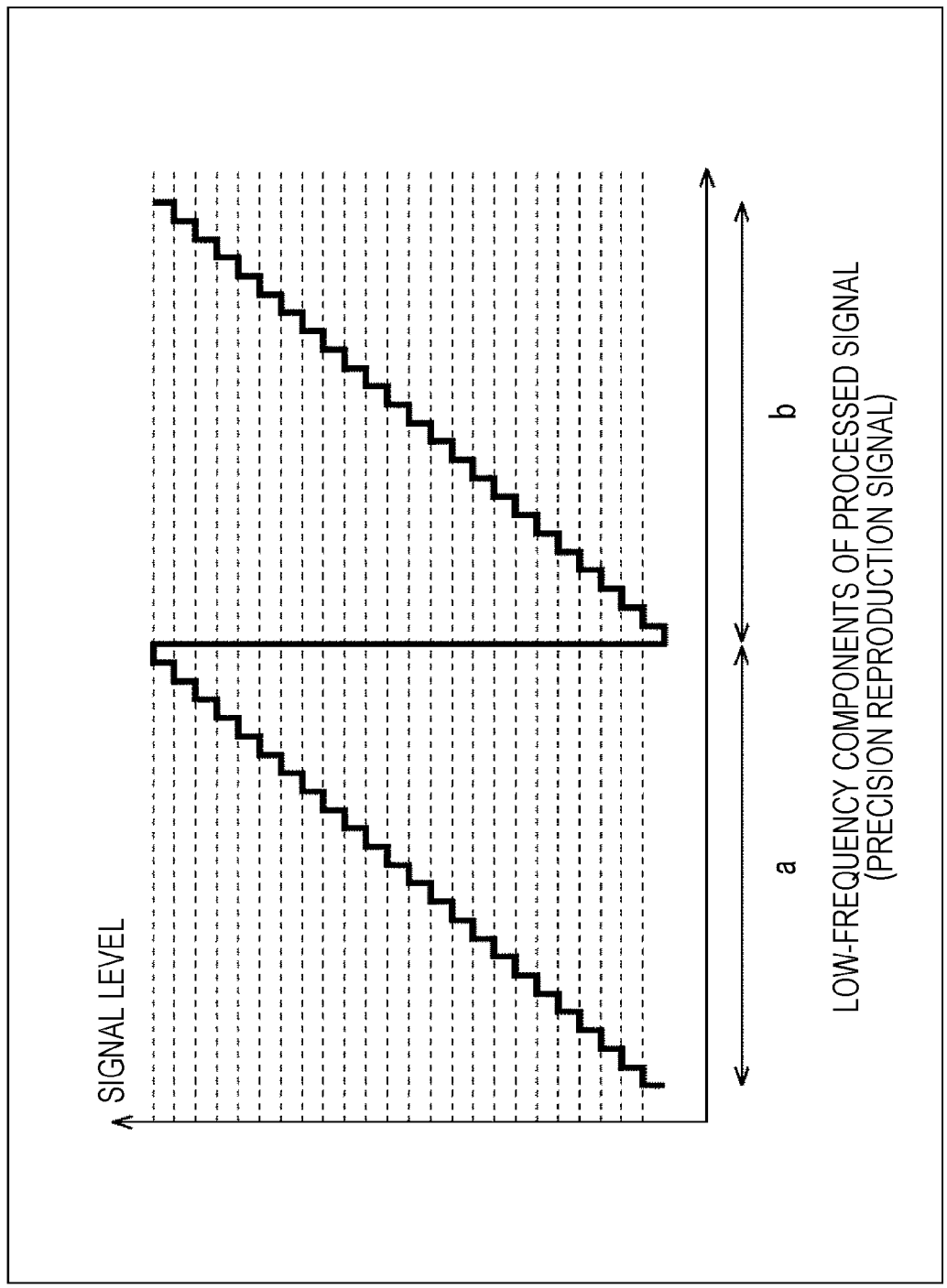
FIG. 13 illustrates details of processing performed by the information processing device of FIG. 6.

FIG. 13 illustrates M bit length low-frequency components (precision reproduction signal) extracted by the low-frequency component extraction unit 42 from the M-L bit length processed signal of FIG. 10.

Herein, there will be described the meaning of Expression (1) described above (O=A·α+B·(1−α)) used for calculating the reproduction signal O in the α blending unit 44. The α blending unit 44 takes in (the signal level of) the M-L bit length processed signal A of FIG. 10, (the signal level of) the precision reproduction signal B of FIG. 13, and (the signal level of) the high-frequency components α of the unprocessed signal of FIG. 12.

At this time, low-frequency components of the reproduction signal O is the precision reproduction signal B serving as low-frequency components of the processed signal.

Meanwhile, it is estimated that high-frequency components of the reproduction signal O are proportional to a difference (A−B) between the processed signal A and the precision reproduction signal B and are also proportional to the high-frequency components α of the unprocessed signal. Thus, the high-frequency components thereof are (A−B)·α.

Then, the reproduction signal O is obtained by adding the precision reproduction signal B serving as the low-frequency components of the reproduction signal O and the high-frequency components (A−B)·α of the reproduction signal O. Thus, O=B+(A−B)·α=A·α+B·(1−α) is satisfied, and therefore Expression (1) described above is derived.

Therefore, Expression (1) means that the reproduction signal O is calculated by adding the low-frequency components (precision reproduction signal) B and the high-frequency components (B−A)·α of the reproduction signal O.

Figure 14:
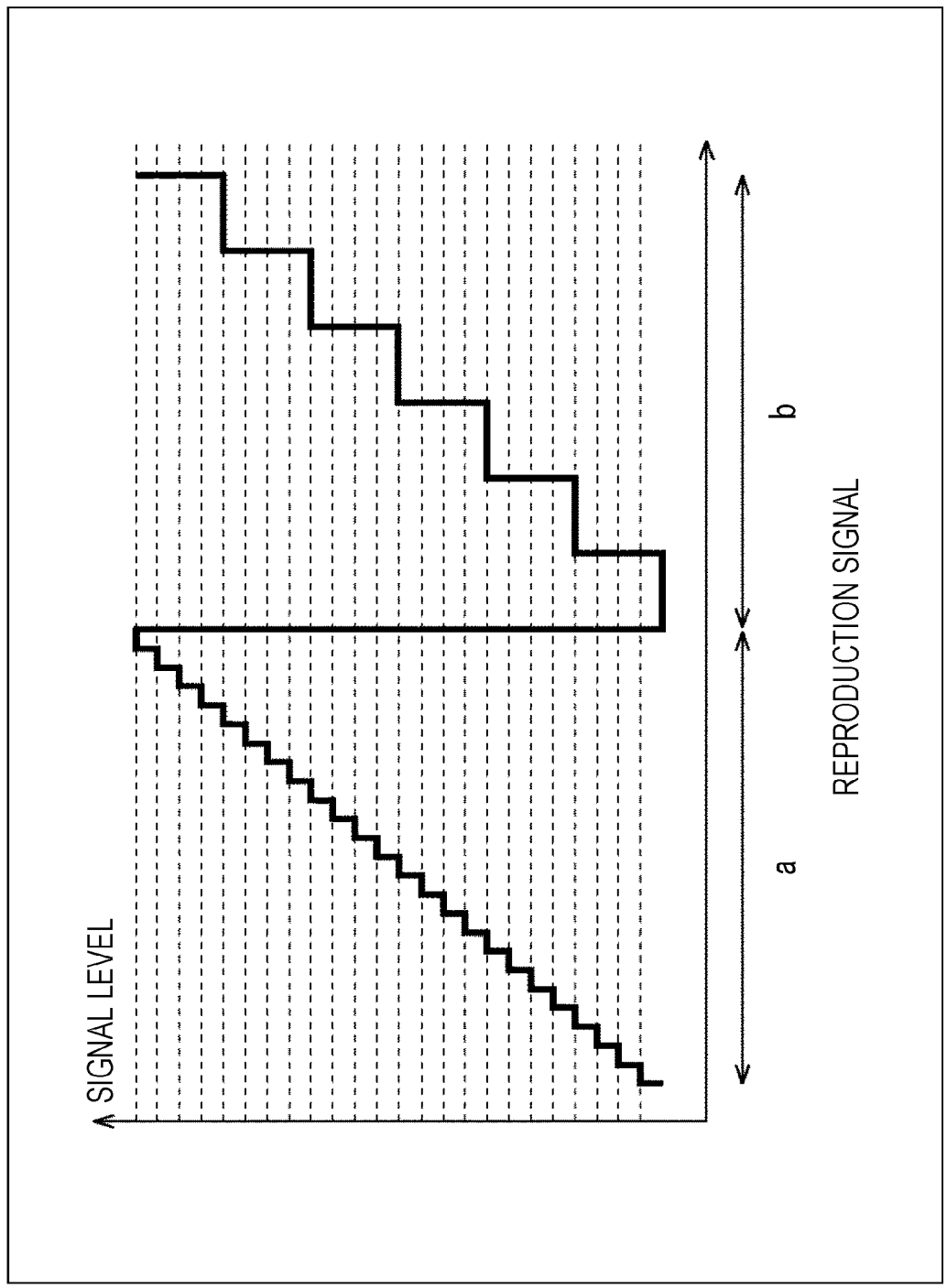
FIG. 14 illustrates details of processing performed by the information processing device of FIG. 6.

FIG. 14 illustrates the reproduction signal O output from the α blending unit 44 with respect to the processed signal A of FIG. 10, the high-frequency components α of FIG. 12, and the precision reproduction signal B of FIG. 13. The reproduction signal O of FIG. 14 in the period a substantially matches the precision reproduction signal B in the period a of FIG. 13 and also substantially matches the unprocessed signal in the period a of FIG. 9. This result is caused by the following facts: the unprocessed signal in the period a of FIG. 9 has a linear waveform; and the high-frequency components α in the period a of FIG. 12 have a substantially zero value.

Meanwhile, the reproduction signal O of FIG. 14 in the period b substantially matches the unprocessed signal in the period b of FIG. 9. This result is caused by a fact that, because a large number of high-frequency components α exist in the period b of FIG. 12, the stepwise waveform of the unprocessed signal in the period b of FIG. 9 is reflected when the reproduction signal O is calculated by Expression (1) described above.

As described above, the reproduction signal O of FIG. 14 output from the α blending unit 44 has waveforms in which the waveforms in the periods a and b of the unprocessed signal of FIG. 9 are reflected. Thus, the reproduction signal O is an appropriate reproduction signal in which the quantization precision of the processed signal is increased and the quantization error is reduced.

Note that the high-frequency components extracted by the high-frequency component extraction unit 40 are not directly set as the a value in the α blending unit 44, and instead a value obtained by adjusting a magnitude of the high-frequency components may be set as the α value.

<< Another Specific Configuration Example of Information Processing Device 10>>

Figure 15:
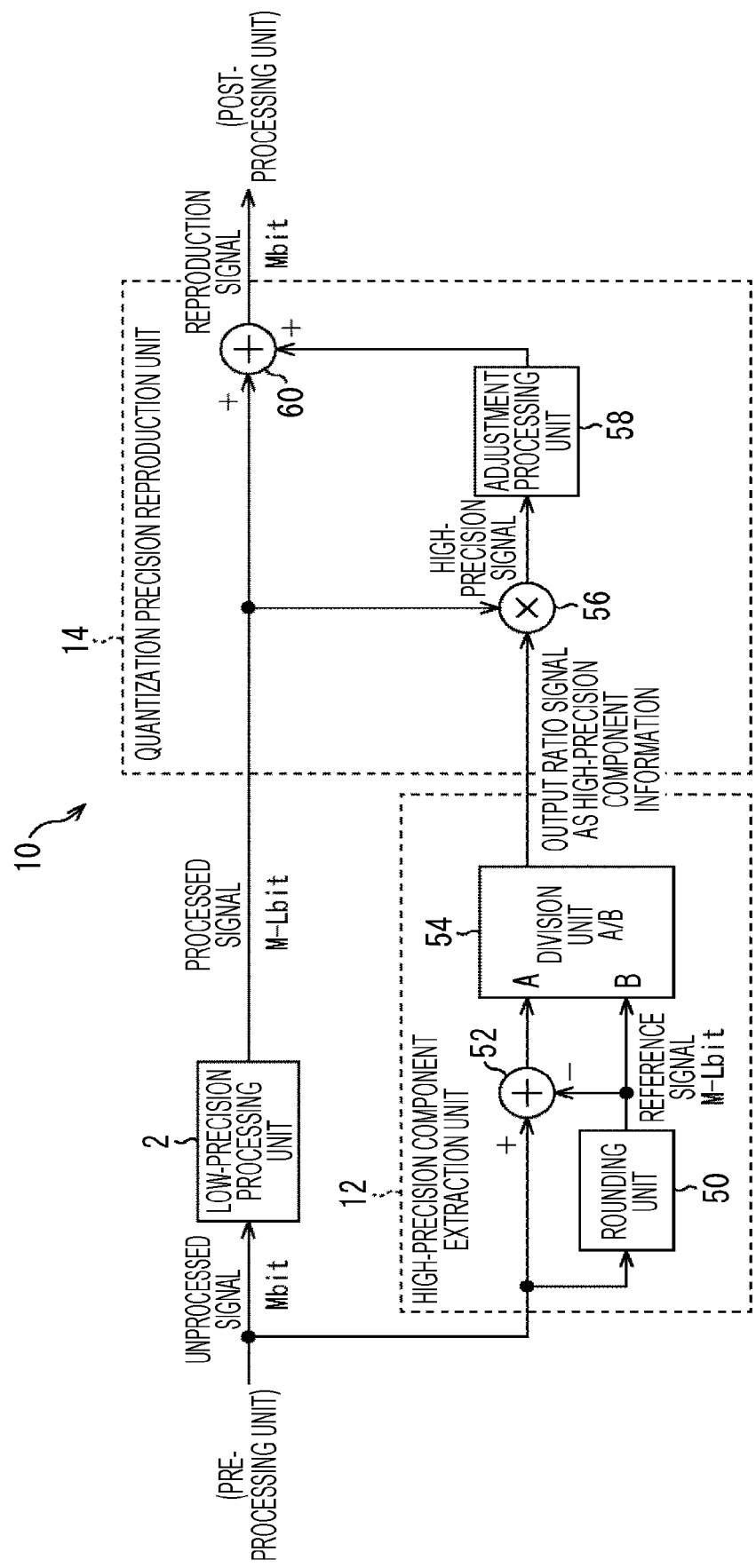
FIG. 15 is a block diagram illustrating another configuration example of a high-precision component extraction unit and a quantization precision reproduction unit of an information processing device.

FIG. 15 is a block diagram illustrating another configuration example of the high-precision component extraction unit 12 and the quantization precision reproduction unit 14 of the information processing device 10 in FIG. 1.

Note that the high-precision component extraction unit 12 and the quantization precision reproduction unit 14 in FIG. 5 are configured as in FIG. 15. Further, for example, an image signal output by the high-precision processing unit 28 of FIG. 5 is employed as an unprocessed signal having M bits.

<High-Precision Component Extraction Unit 12>

The high-precision component extraction unit 12 includes a rounding unit 50, a subtraction unit 52, and a division unit 54.

The rounding unit 50 acquires an M bit length unprocessed signal supplied from the pre-processing unit to the low-precision processing unit 2.

Then, the rounding unit 50 removes least significant L bits of the acquired M bit length unprocessed signal, thereby generating an M-L bit length digital signal (reference signal).

The rounding unit 50 supplies the generated M-L bit length reference signal to the subtraction unit 52 and the division unit 54. The M-L bit length reference signal indicates a digital signal obtained by reducing the quantization precision of the M bit length unprocessed signal to the M-L bit length.

The subtraction unit 52 subtracts (a signal level of) the M-L bit length reference signal supplied from the rounding unit 50 from (a signal level of) the M bit length unprocessed signal to be supplied to the low-precision processing unit 2, thereby calculating a difference between the unprocessed signal and the reference signal.

Then, the subtraction unit 52 supplies the calculated difference to the division unit 54 as an M bit length digital signal. The difference indicates an error occurring when the quantization precision of the unprocessed signal is reduced from the M bit length to the M-L bit length.

The division unit 54 acquires the reference signal (signal level) B from the rounding unit 50 and acquires the difference (signal level) A from the subtraction unit 52.

Then, the division unit 54 divides the difference A by the reference signal B, thereby generating an M bit length ratio signal indicating a ratio of the difference A to the reference signal B.

The division unit 54 supplies the generated ratio signal to the quantization precision reproduction unit 14 as the high-precision component information. The ratio signal supplied from the division unit 54 to the quantization precision reproduction unit 14 is a signal corresponding to the high-frequency components α supplied from the high-frequency component extraction unit 40 to the quantization precision reproduction unit 14 in the embodiment of FIG. 6.

Note that, because the division unit 54 obtains the ratio signal (normalizes the difference), even in a case where the processed signal is greatly changed from the unprocessed signal by gain calculation or the like in the low-precision processing unit 2, it is possible to generate a more accurate reproduction signal that is not affected by such a great change.

Further, a reason why the difference A is divided not by the unprocessed signal but by the reference signal B in the division unit 54 is that, because the quantization precision reproduction unit 14 reproduces the quantization precision on the basis of the M-L bit length processed signal, the division unit 54 performs normalization also by using a signal rounded to the M-L bit length and can therefore generate an accurate reproduction signal.

<Quantization Precision Reproduction Unit 14>

The quantization precision reproduction unit 14 includes a multiplication unit 56, an adjustment processing unit 58, and an addition unit 60.

The multiplication unit 56 multiplies the processed signal supplied from the low-precision processing unit 2 by the ratio signal supplied from the division unit 54, thereby generating an M bit length high-precision signal in which a minute change of the unprocessed signal is reflected.

Then, the multiplication unit 56 supplies the generated high-precision signal to the adjustment processing unit 58.

The adjustment processing unit 58 performs adjustment processing such as gain adjustment, offset, and filtering on the M bit length high-precision signal supplied from the multiplication unit 56 and supplies the M bit length high-precision signal subjected to the adjustment processing to the addition unit 60. Note that the adjustment processing unit 58 may not be provided, and the high-precision signal may be directly supplied from the multiplication unit 56 to the addition unit 60. Further, the M bit length high-precision signal supplied from the multiplication unit 56 to the addition unit 60 is a signal (high-precision digital signal) generated from the processed signal and having high quantization precision and is a signal corresponding to the precision reproduction signal B serving as the high-precision digital signal supplied from the low-frequency component extraction unit 42 to the a blending unit 44 in the embodiment of FIG. 6.

The addition unit 60 adds (combines) the M-L bit length processed signal supplied from the low-precision processing unit 2 and the M bit length high-precision signal supplied from the adjustment processing unit 58, thereby generating an M bit length reproduction signal.

Then, the addition unit 60 outputs the generated M bit length reproduction signal to the post-processing unit. Note that the processed signal supplied from the low-precision processing unit 2 to the addition unit 60, the high-precision signal supplied from the multiplication unit 56 to the addition unit 60, and the ratio signal supplied from the division unit 54 to the multiplication unit 56 correspond to the processed signal A supplied from the low-precision processing unit 2 to the α blending unit 44, the precision reproduction signal B supplied from the low-frequency component extraction unit 42 to the α blending unit 44, and the high-frequency components α supplied from the high-frequency component extraction unit 40 to the α blending unit 44, respectively, in the embodiment of FIG. 6. Therefore, the multiplication unit 56 and the addition unit 60 are processing units corresponding to the α blending unit 44 in the embodiment of FIG. 6.

<<Information Processing Procedure>>

Figure 16:
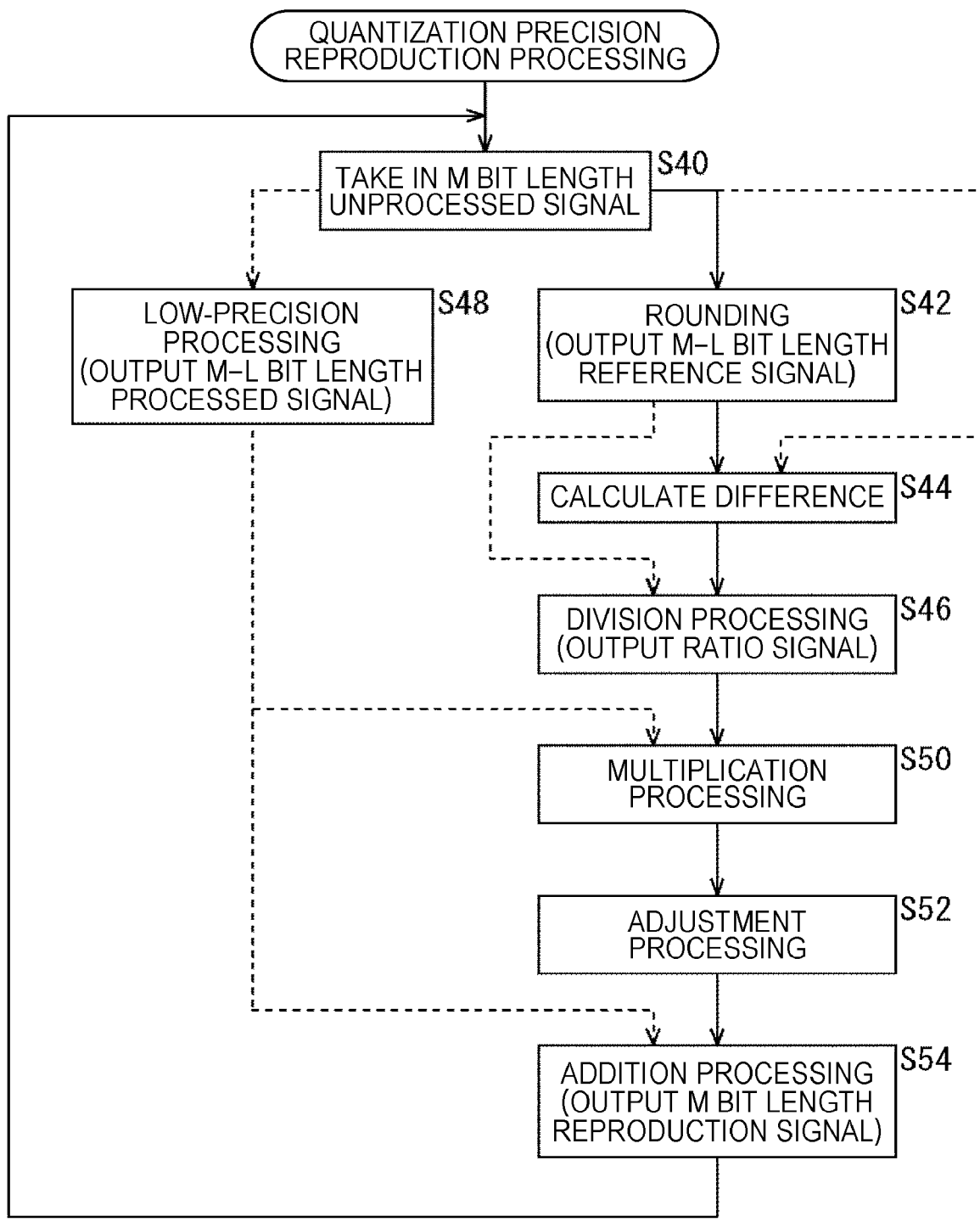
FIG. 16 is a flowchart showing an example of processing performed by a low-precision processing unit and the information processing device of FIG. 15.

FIG. 16 is a flowchart showing an example of processing performed by the low-precision processing unit 2 and the information processing device 10 of FIG. 15.

In step S40, the low-precision processing unit 2 and the rounding unit 50 and the subtraction unit 52 of the high-precision component extraction unit 12 take in an M bit length digital signal (unprocessed signal) from the pre-processing unit. The processing proceeds from step S40 to steps S42 and S48.

In step S42, the rounding unit 50 of the high-precision component extraction unit 12 performs rounding for removing least significant L bits from the unprocessed signal taken in in step S40, thereby generating an M-L bit length reference signal. Then, the rounding unit 50 supplies the generated reference signal to the subtraction unit 52 and the division unit 54. The processing proceeds from step S42 to step S44.

In step S44, the subtraction unit 52 of the high-precision component extraction unit 12 subtracts the reference signal supplied from the rounding unit 50 in step S42 from the unprocessed signal taken in in step S40, thereby calculating a difference between the unprocessed signal and the reference signal. Then, the subtraction unit 52 supplies the calculated difference to the division unit 54. The processing proceeds from step S44 to step S46.

In step S46, the division unit 54 of the high-precision component extraction unit 12 divides the difference supplied from the subtraction unit 52 in step S44 by the reference signal supplied from the rounding unit 50 in step S42, thereby generating an M bit length ratio signal. Then, the division unit 54 supplies the generated ratio signal to the multiplication unit 56 of the quantization precision reproduction unit 14 as the high-precision component information. The processing proceeds from step S46 to step S50.

Meanwhile, in step S48, the low-precision processing unit 2 performs predetermined signal processing on the unprocessed signal taken in in step S40 and supplies an M-L bit length processed signal indicating a processing result to the multiplication unit 56 and the addition unit 60 of the quantization precision reproduction unit 14. The processing proceeds from step S48 to step S50.

In step S50, the multiplication unit 56 of the quantization precision reproduction unit 14 multiplies the processed signal supplied from the low-precision processing unit 2 in step S48 by the ratio signal supplied from the division unit 54 in step S46, thereby generating an M bit length high-precision signal. Then, the multiplication unit 56 supplies the generated high-precision signal to the adjustment processing unit 58. The processing proceeds from step S50 to step S52.

In step S52, the adjustment processing unit 58 of the quantization precision reproduction unit 14 performs predetermined adjustment processing on the M bit length high-precision signal supplied from the multiplication unit 56 in step S50 and supplies the M bit length high-precision signal subjected to the adjustment processing to the addition unit 60. The processing proceeds from step S52 to step S54.

In step S54, the addition unit 60 of the quantization precision reproduction unit 14 adds the M-L bit length processed signal supplied from the low-precision processing unit 2 in step S48 and the M bit length high-precision signal supplied from the adjustment processing unit 58 in step S52. The addition unit 60 generates an M bit length reproduction signal by the addition and outputs the reproduction signal to the post-processing unit. Then, the processing returns from step S54 to step S40, and the processing in steps S40 to S54 is repeated.

<< Details of Processing >>

Next, the processing in the high-precision component extraction unit 12 and the quantization precision reproduction unit 14 of the information processing device 10 in FIG. 15 will be described with reference to FIGS. 17 to 22.

In FIGS. 17 to 22, each horizontal axis represents time, and each vertical axis represents a signal level.

Figure 17:
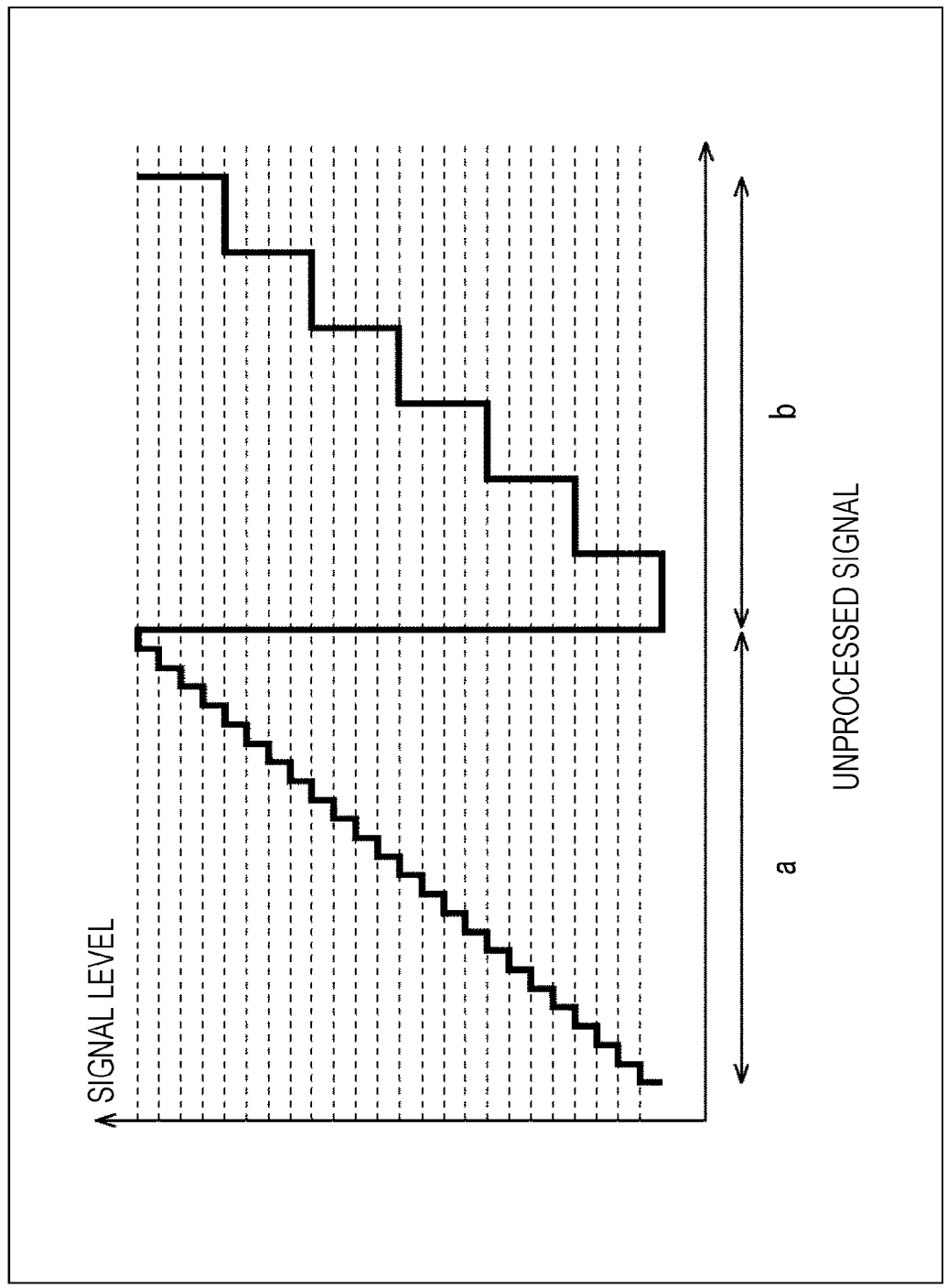
FIG. 17 illustrates details of processing performed by the information processing device of FIG. 15.

FIG. 17, as well as FIG. 9, illustrates an unprocessed signal serving as an M bit length digital signal into which the analog signal of FIG. 8 is converted.

Figure 18:
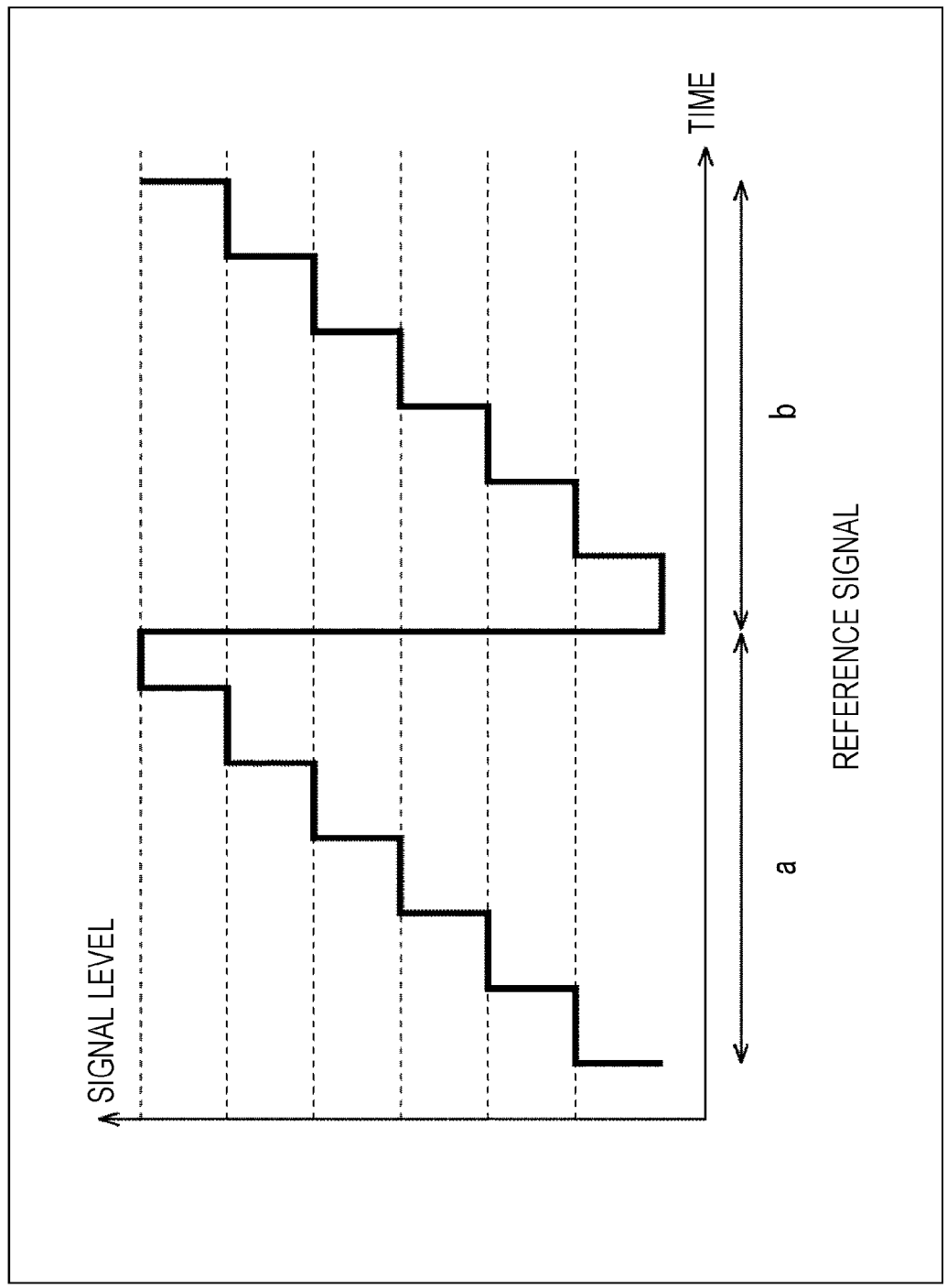
FIG. 18 illustrates details of processing performed by the information processing device of FIG. 15.

FIG. 18 illustrates a reference signal generated by the rounding unit 50 of FIG. 15 from the unprocessed signal of FIG. 17. Further, the reference signal of FIG. 18 corresponds to the M-L bit length processed signal subjected to the signal processing in the low-precision processing unit 2 and then output from the low-precision processing unit 2. Note that, in order to simplify the description, it is assumed that there is no change in the waveforms due to the signal processing performed by the low-precision processing unit 2. In FIG. 18, both the waveform in the period a and the waveform in the period b of the processed signal are stepwise waveforms due to reduction in the quantization precision from the M bit length to the M-L bit length. Thus, a difference between the waveform in the period a and the waveform in the period b is unclear.

Figure 19:
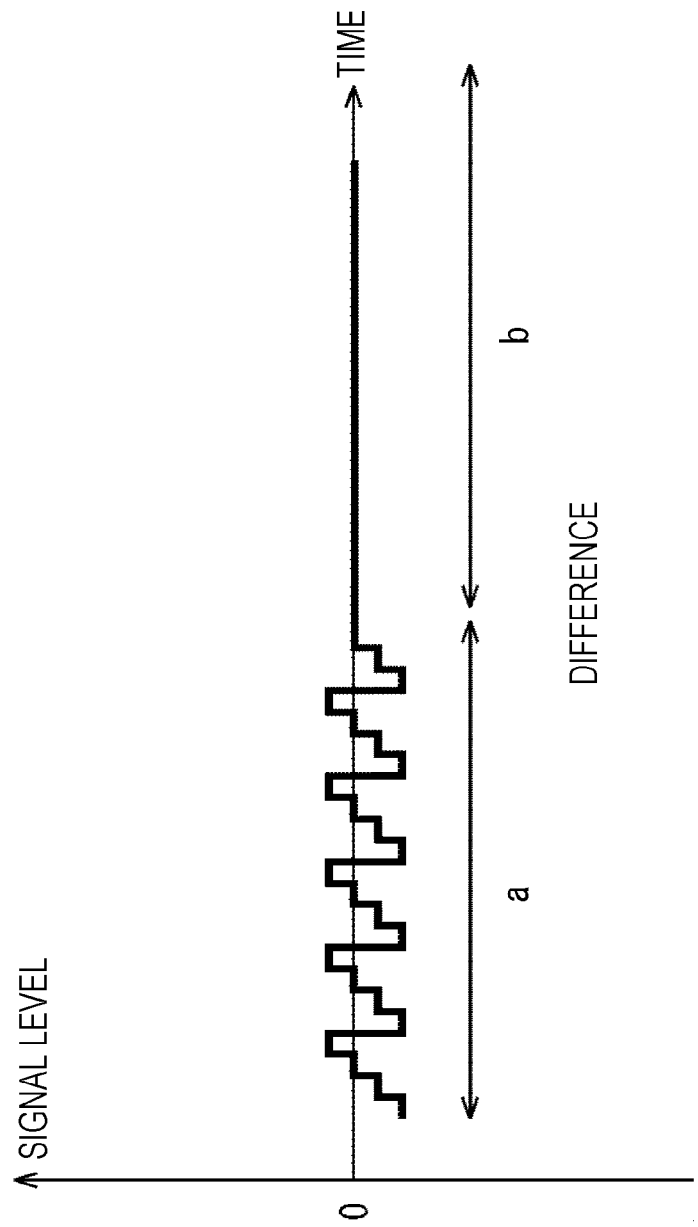
FIG. 19 illustrates details of processing performed by the information processing device of FIG. 15.

FIG. 19 illustrates a difference between the unprocessed signal and the reference signal calculated by the subtraction unit 52. In FIG. 19, signal components that disappear from the unprocessed signal due to the reduction in the quantization precision of the unprocessed signal from the M bit length to the M-L bit length are extracted. In the period a, because the quantization precision of the unprocessed signal is reduced from the M bit length to the M-L bits, the waveform of the unprocessed signal changes from a linear waveform to a stepwise waveform, and thus a sawtooth waveform appears. Meanwhile, in the period b, even in a case where the quantization precision of the unprocessed signal is reduced from the M bit length to the M-L bits, the waveform of the unprocessed signal does not substantially change and therefore indicates a substantially zero value.

Figure 20:
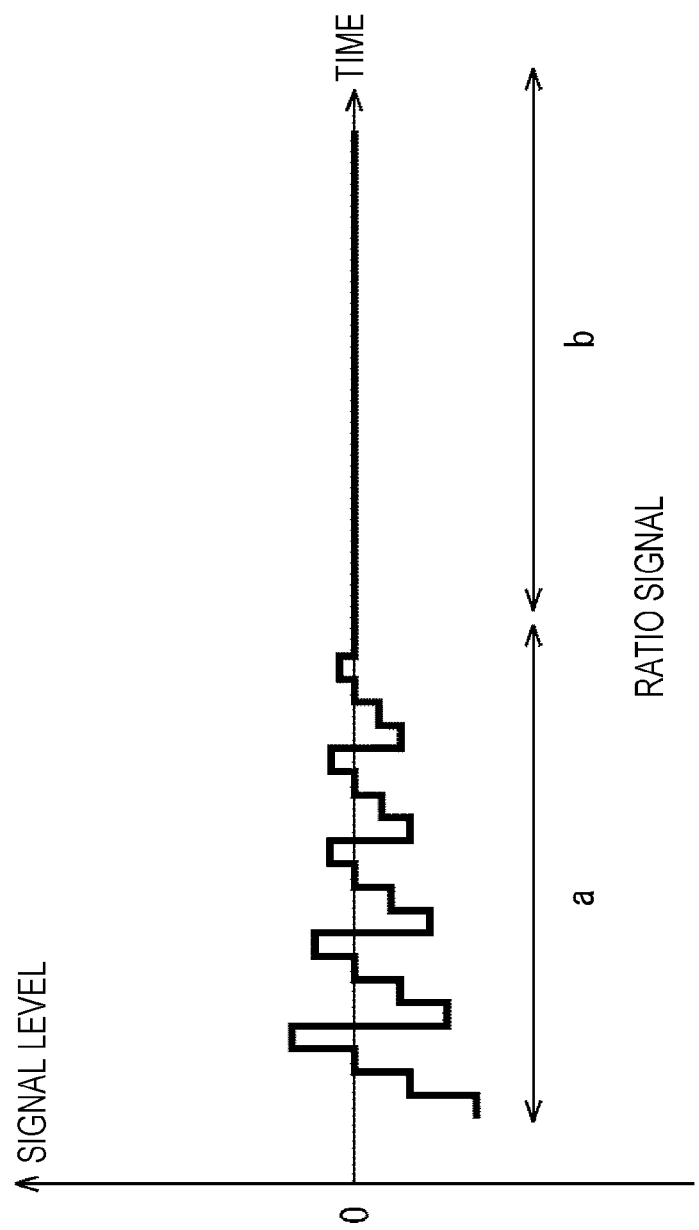
FIG. 20 illustrates details of processing performed by the information processing device of FIG. 15.

FIG. 20 illustrates a ratio signal output from the division unit 54. In the ratio signal of FIG. 20, the reference signal (see FIG. 18) gradually increases stepwise in the period a, and therefore the sawtooth waveform of the difference in the period a of FIG. 19 decreases stepwise for each wave. Meanwhile, in the ratio signal of FIG. 20, because the difference is substantially zero in the period b of FIG. 19, the ratio signal is also substantially zero in the period b of FIG. 20.

Figure 21:
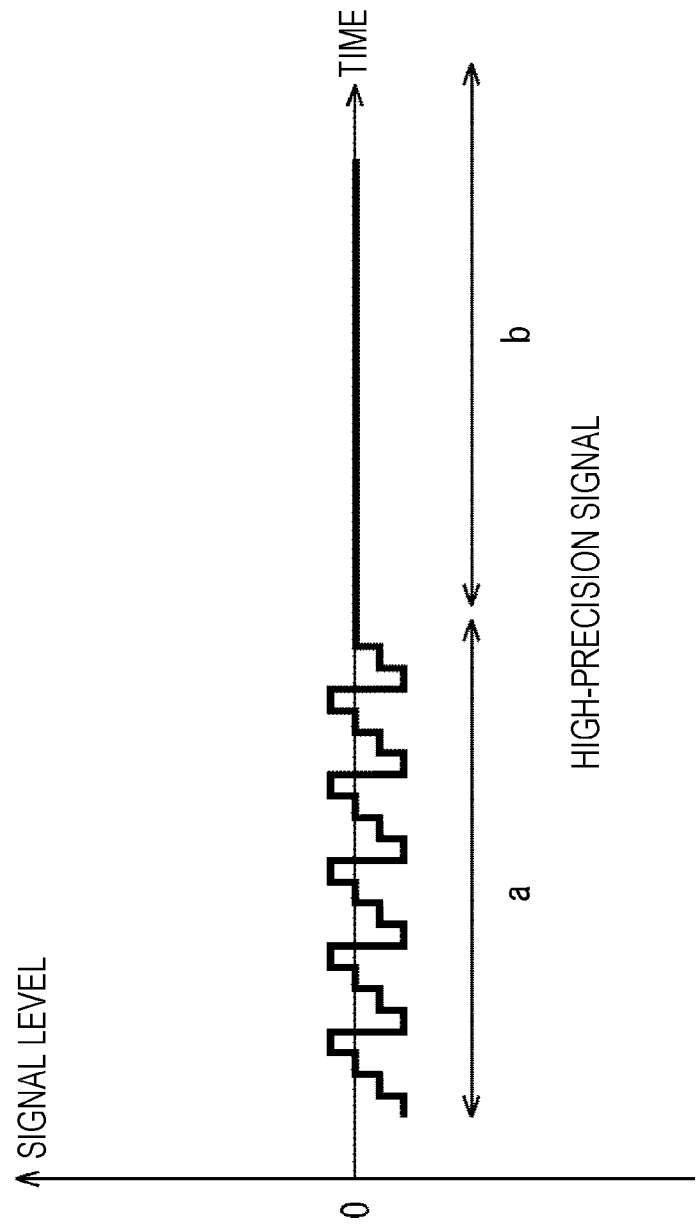
FIG. 21 illustrates details of processing performed by the information processing device of FIG. 15.

FIG. 21 illustrates the high-precision signal calculated by the multiplication unit 56 of the quantization precision reproduction unit 14. The high-precision signal of FIG. 21 has the same waveform as the signal indicating the difference of FIG. 19. This result is obtained because the reference signal generated by the rounding unit 50 and the processed signal generated by the low-precision processing unit 2 in FIG. 18 have the same waveform. In a case where the waveform of the processed signal is different from that of the reference signal due to the signal processing in the low-precision processing unit 2, the waveform of the high-precision signal in FIG. 21 is also different from that of the difference in FIG. 19.

Figure 22:
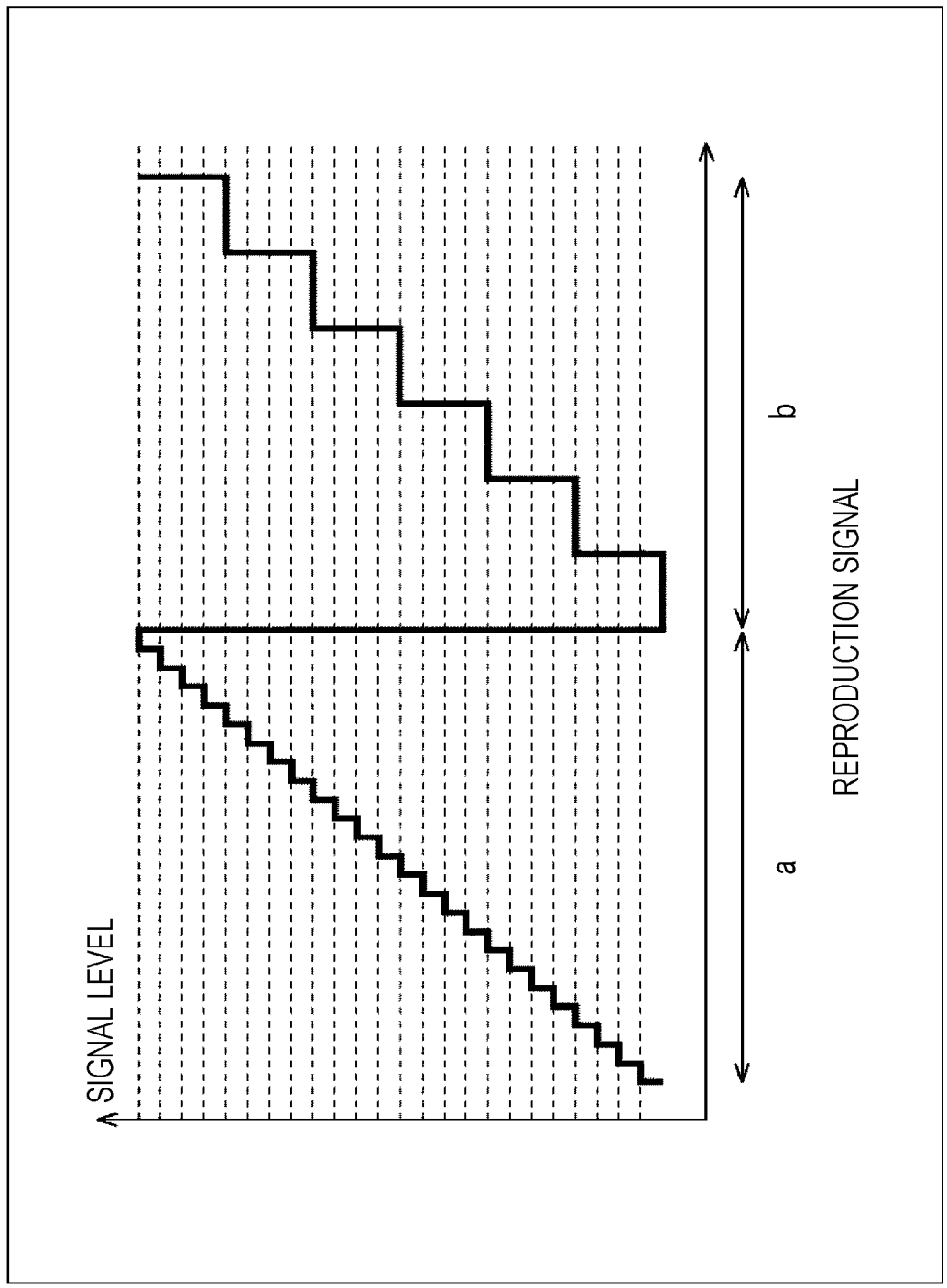
FIG. 22 illustrates details of processing performed by the information processing device of FIG. 15.

FIG. 22 illustrates the reproduction signal generated by the addition unit 60. Note that an influence of the processing performed by the adjustment processing unit 58 is not considered. A waveform of the reproduction signal in FIG. 22 substantially matches the waveform of the unprocessed signal in FIG. 17, and therefore a processed signal (substantially) similar to a signal obtained in a case where the processing in the low-precision processing unit 2 is performed by using the M bit length, instead of using the reduced M-L bit length, is reproduced. That is, the reproduction signal generated by the addition unit 60 and output from the quantization precision reproduction unit 14 is an appropriate reproduction signal in which the quantization precision of the processed signal is increased and the quantization error is reduced.

<< Second Embodiment of Information Processing Device >>

Figure 23:
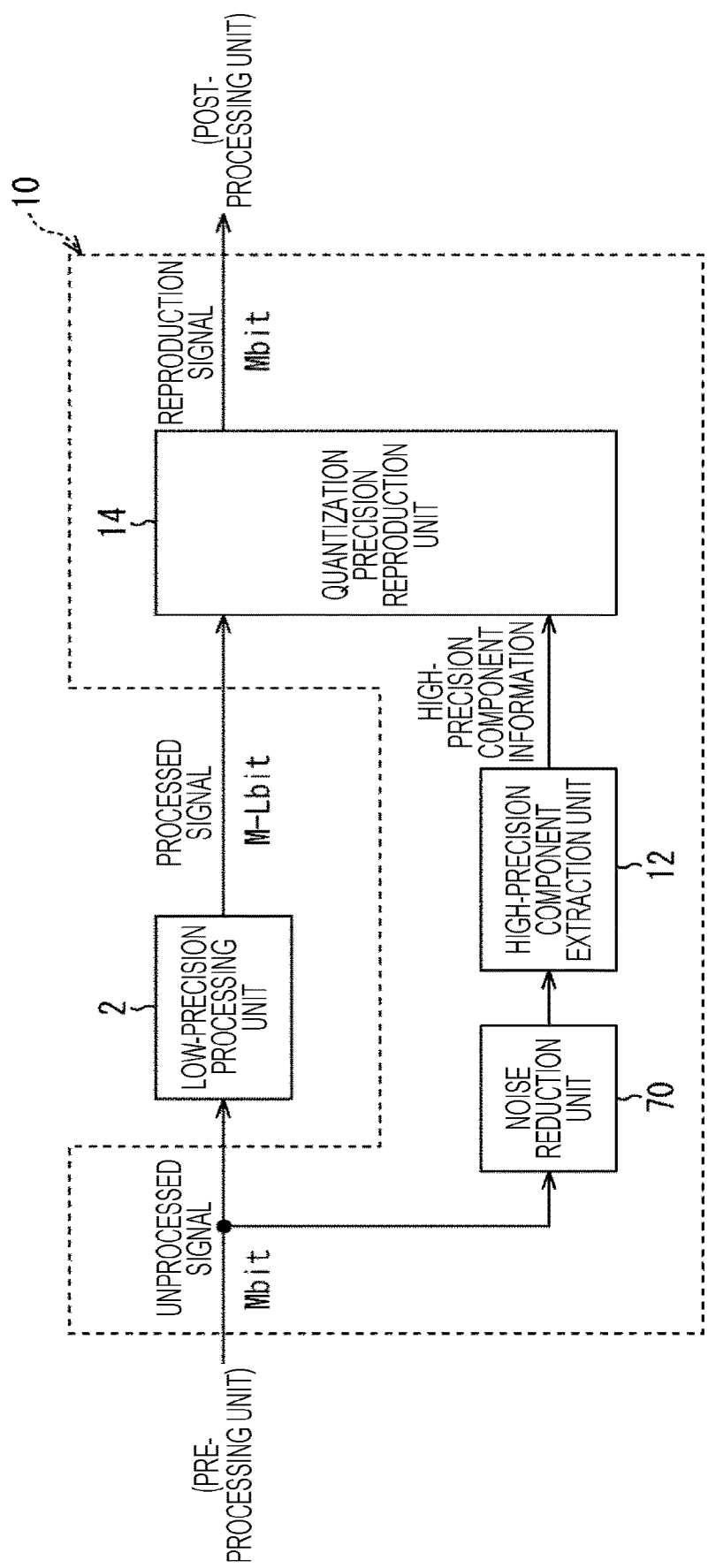
FIG. 23 is a block diagram illustrating a configuration example of a second embodiment of an information processing device.

FIG. 23 is a block diagram illustrating a configuration example of a second embodiment of an information processing device to which the present technology is applied.

Note that, in FIG. 23, parts corresponding to the parts of the information processing device 10 in FIG. 1 are denoted by the same reference signs, and description thereof will be appropriately omitted.

The information processing device 10 of FIG. 23 includes the high-precision component extraction unit 12, the quantization precision reproduction unit 14, and a noise reduction unit 70. Therefore, the information processing device 10 of FIG. 23 is the same as that of FIG. 1 in that the high-precision component extraction unit 12 and the quantization precision reproduction unit 14 are provided. However, the information processing device 10 of FIG. 23 is different from that of FIG. 1 in that the noise reduction unit 70 is newly provided.

In FIG. 23, the noise reduction unit 70 is arranged before the high-precision component extraction unit 12 of the information processing device 10.

The noise reduction unit 70 acquires an M bit length unprocessed signal supplied from the pre-processing unit to the low-precision processing unit 2.

Then, the noise reduction unit 70 removes noise included in the acquired unprocessed signal by using a median filter or the like and supplies a digital signal from which the noise has been removed to the high-precision component extraction unit 12.

According to the information processing device 10 of FIG. 23, even in a case where the unprocessed signal includes noise, the noise is removed by the noise reduction unit 70. Therefore, accurate high-precision component information is extracted by the high-precision component extraction unit 12.

<< Third Embodiment of Information Processing Device >>

Figure 24:
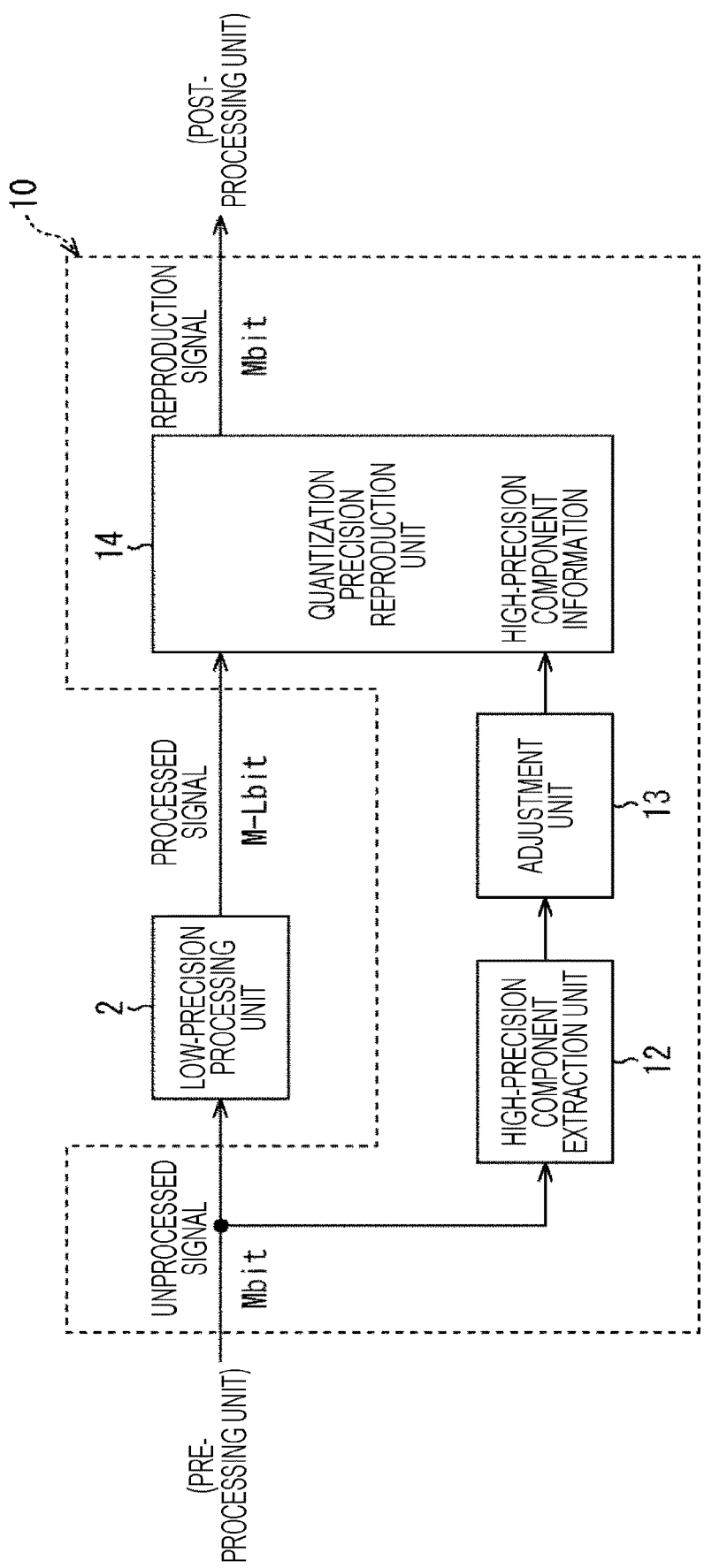
FIG. 24 is a block diagram illustrating a configuration example of a third embodiment of an information processing device.

FIG. 24 is a block diagram illustrating a configuration example of a third embodiment of an information processing device to which the present technology is applied.

Note that, in FIG. 24, parts corresponding to the parts of the information processing device 10 in FIG. 1 are denoted by the same reference signs, and description thereof will be omitted.

The information processing device 10 of FIG. 24 includes the high-precision component extraction unit 12, an adjustment unit 13, and the quantization precision reproduction unit 14. Therefore, the information processing device 10 of FIG. 24 is the same as that of FIG. 1 in that the high-precision component extraction unit 12 and the quantization precision reproduction unit 14 are provided. However, the information processing device 10 of FIG. 24 is different from that of FIG. 1 in that the adjustment unit 13 is newly provided.

In FIG. 24, the adjustment unit 13 is provided between the high-precision component extraction unit 12 and the quantization precision reproduction unit 14.

High-precision component information extracted by the high-precision component extraction unit 12 is supplied to the adjustment unit 13. The adjustment unit 13 adjusts a magnitude of high-frequency components and a ratio signal of an unprocessed signal serving as the supplied high-precision component information and supplies the adjusted high-precision component information to the quantization precision reproduction unit 14.

The adjustment unit 13 performs gain adjustment at a predetermined magnification on the high-precision component information supplied from the high-precision component extraction unit 12. Alternatively, the adjustment unit 13 performs normalization processing on the high-precision component information supplied from the high-precision component extraction unit 12 so that the high-precision component information has a signal level falling within a predetermined range. The magnification in the gain adjustment may be a predetermined value or may be a value that can be appropriately set and changed by the user. The range for the normalization may be a range between a predetermined upper limit value and a predetermined lower limit value or may be a range between an upper limit value and a lower limit value that can be appropriately set and changed by the user.

Because the adjustment unit 13 is provided, it is possible to adjust a ratio of contribution of the high-precision component information extracted by the high-precision component extraction unit 12 to the quantization precision reproduction unit 14. Further, for example, in the information processing device 10 of FIG. 6, it is possible to adjust a magnitude of the high-frequency components supplied as the high-precision component information from the high-frequency component extraction unit 40 to the a blending unit 44.

<< Second Configuration Example of Imaging Device>>

Figure 25:
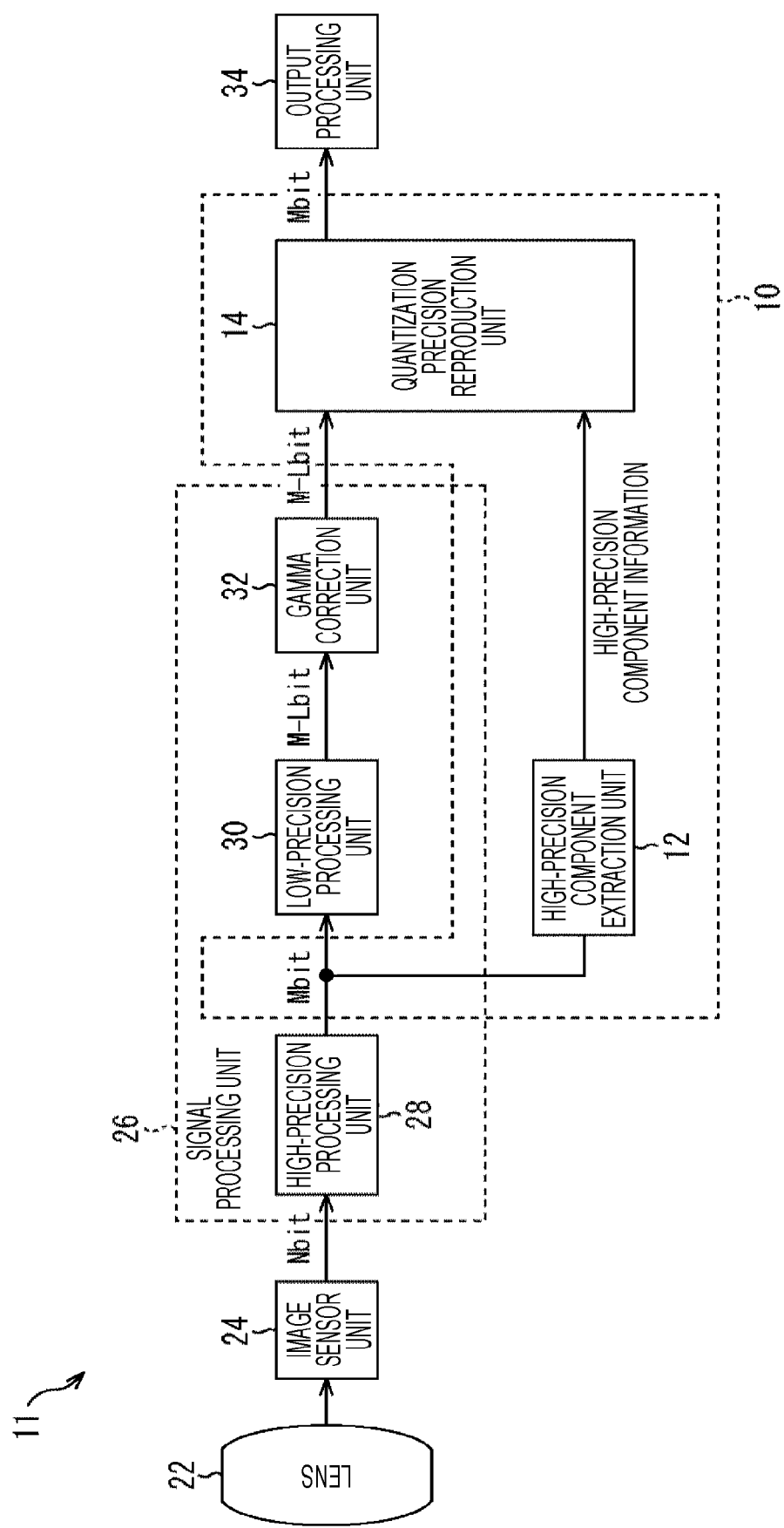
FIG. 25 is a block diagram illustrating a second configuration example of an imaging device.

FIG. 25 is a block diagram illustrating a second configuration example of an imaging device to which the present technology is applied.

Note that, in FIG. 25, parts corresponding to the parts of the imaging device 11 in FIG. 5 are denoted by the same reference signs, and description thereof will be appropriately omitted.

The imaging device 11 of FIG. 25 includes the information processing device 10, the lens 22, the image sensor unit 24, the signal processing unit 26, and the output processing unit 34. Further, the signal processing unit 26 includes the high-precision processing unit 28, the low-precision processing unit 30, and the gamma correction unit 32. Therefore, the imaging device 11 of FIG. 25 is the same as that of FIG. 5 in that the information processing device 10, the lens 22, the image sensor unit 24, and the signal processing unit 26 are provided and in that the signal processing unit 26 includes the high-precision processing unit 28 and the low-precision processing unit 30. However, the imaging device 11 of FIG. 25 is different from that of FIG. 5 in that the gamma correction unit 32 is provided in the signal processing unit 26 instead of in the imaging device 11.

In FIG. 25, the gamma correction unit 32 is arranged after the low-precision processing unit 30 of the signal processing unit 26, and the quantization precision reproduction unit 14 of the information processing device 10 is arranged after the gamma correction unit 32.

An M-L bit length image signal (processed signal) subjected to the signal processing by the low-precision processing unit 30 is supplied to the gamma correction unit 32.

The gamma correction unit 32 performs gamma correction processing on the processed signal supplied from the low-precision processing unit 30 and supplies an M-L bit length digital signal (processed signal) to the quantization precision reproduction unit 14 as a processing result.

As in FIG. 5, the quantization precision reproduction unit 14 reproduces the quantization precision of the processed signal supplied from the gamma correction unit 32 to an M bit length, thereby generating an M bit length reproduction signal. Then, the quantization precision reproduction unit 14 supplies the generated reproduction signal to the output processing unit 34.

In the gamma correction, gain-up is generally performed in particular in a region having a low signal level, and therefore data of least significant bits is increased to most significant bits. Thus, a grayscale of an image tends to be insufficient, and reduction in the quantization precision tends to be visually recognized from the image. As to the above point, the quantization precision reproduction unit 14 reproduces the quantization precision to the M bit length with respect to the image signal subjected to the gamma correction, thereby improving signal quality and solving the insufficiency of the grayscale of the image.

<< Third Configuration Example of Imaging Device>>

In the imaging device 11 of FIG. 5, the gamma correction unit 32 and the output processing unit 34 are arranged after the quantization precision reproduction unit 14 of the information processing device 10. However, a destination to which a reproduction signal generated by the quantization precision reproduction unit 14 is supplied is not limited to a specific processing unit.

Figure 26:
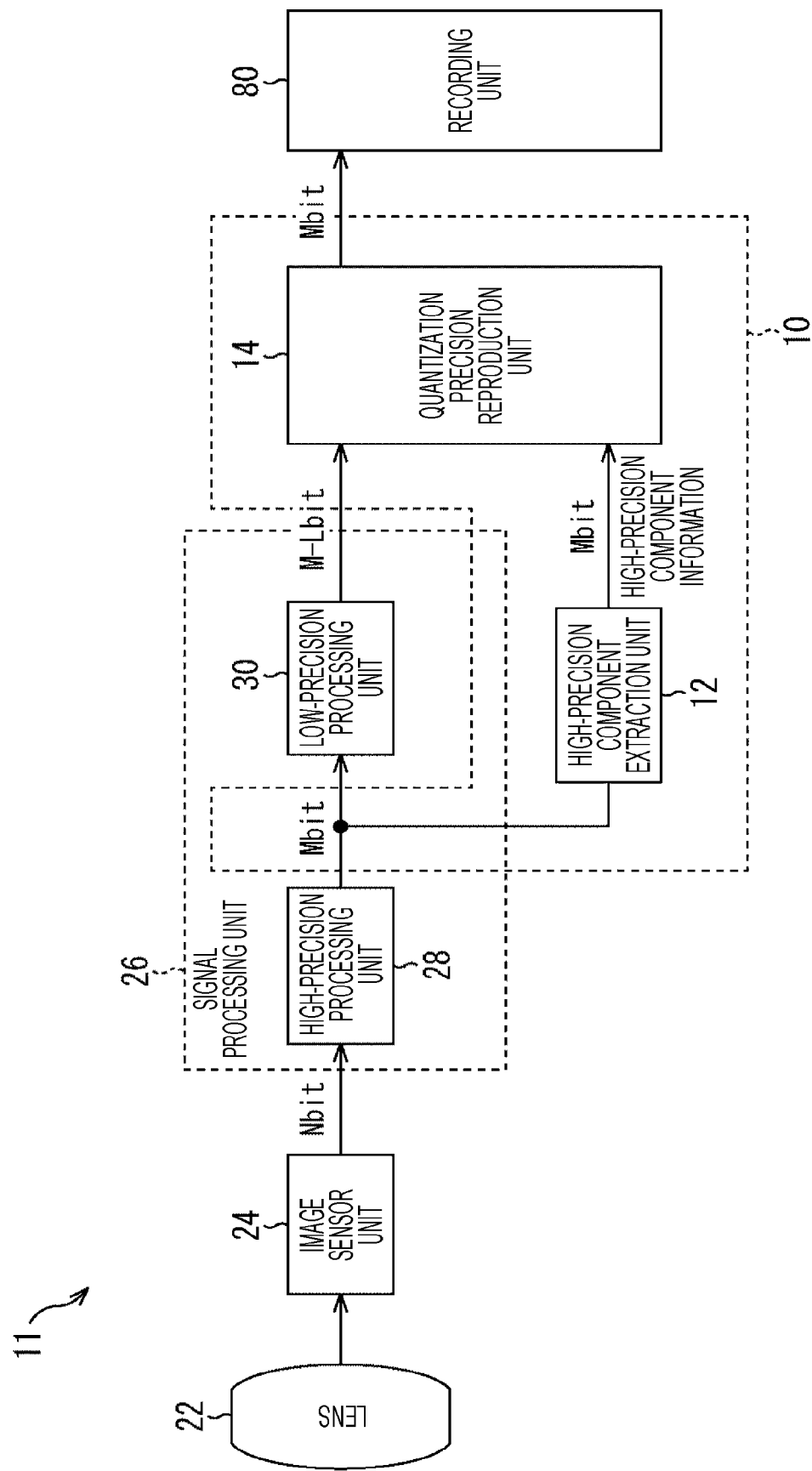
FIG. 26 is a block diagram illustrating a third configuration example of an imaging device.

FIG. 26 is a block diagram illustrating a third configuration example of an imaging device to which the present technology is applied.

Note that, in FIG. 26, parts corresponding to the parts of the imaging device 11 in FIG. 5 are denoted by the same reference signs, and description thereof will be appropriately omitted.

The imaging device 11 of FIG. 26 includes the information processing device 10, the lens 22, the image sensor unit 24, the signal processing unit 26, and a recording unit 80. Therefore, the imaging device 11 of FIG. 26 is the same as that of FIG. 5 in that the information processing device 10, the lens 22, the image sensor unit 24, and the signal processing unit 26 are provided. However, the imaging device 11 of FIG. 26 is different from that of FIG. 5 in that the gamma correction unit 32 and the output processing unit 34 are not provided and the recording unit 80 is newly provided.

As compared with the imaging device 11 of FIG. 5, the imaging device 11 of FIG. 26 does not include the gamma correction unit 32 or the output processing unit 34 of FIG. 5 and includes the recording unit 80 arranged after the quantization precision reproduction unit 14. The quantization precision reproduction unit 14 supplies the generated reproduction signal to the recording unit 80 and causes the recording unit 80 to record the reproduction signal (on a recording medium (not illustrated)). Note that a configuration in which a reproduction signal is recorded in the recording unit can be employed not only in the imaging device 20 but also in the information processing device 10.

<< Fourth Configuration Example of Imaging Device>>

In the imaging device 11 of FIG. 26, a reproduction signal supplied from the quantization precision reproduction unit 14 of the information processing device 10 is recorded in the recording unit 80. However, an M-L bit length processed signal output from the low-precision processing unit 30 and high-precision component information of the high-precision component extraction unit 12 may be recorded in the recording unit 80.

Figure 27:
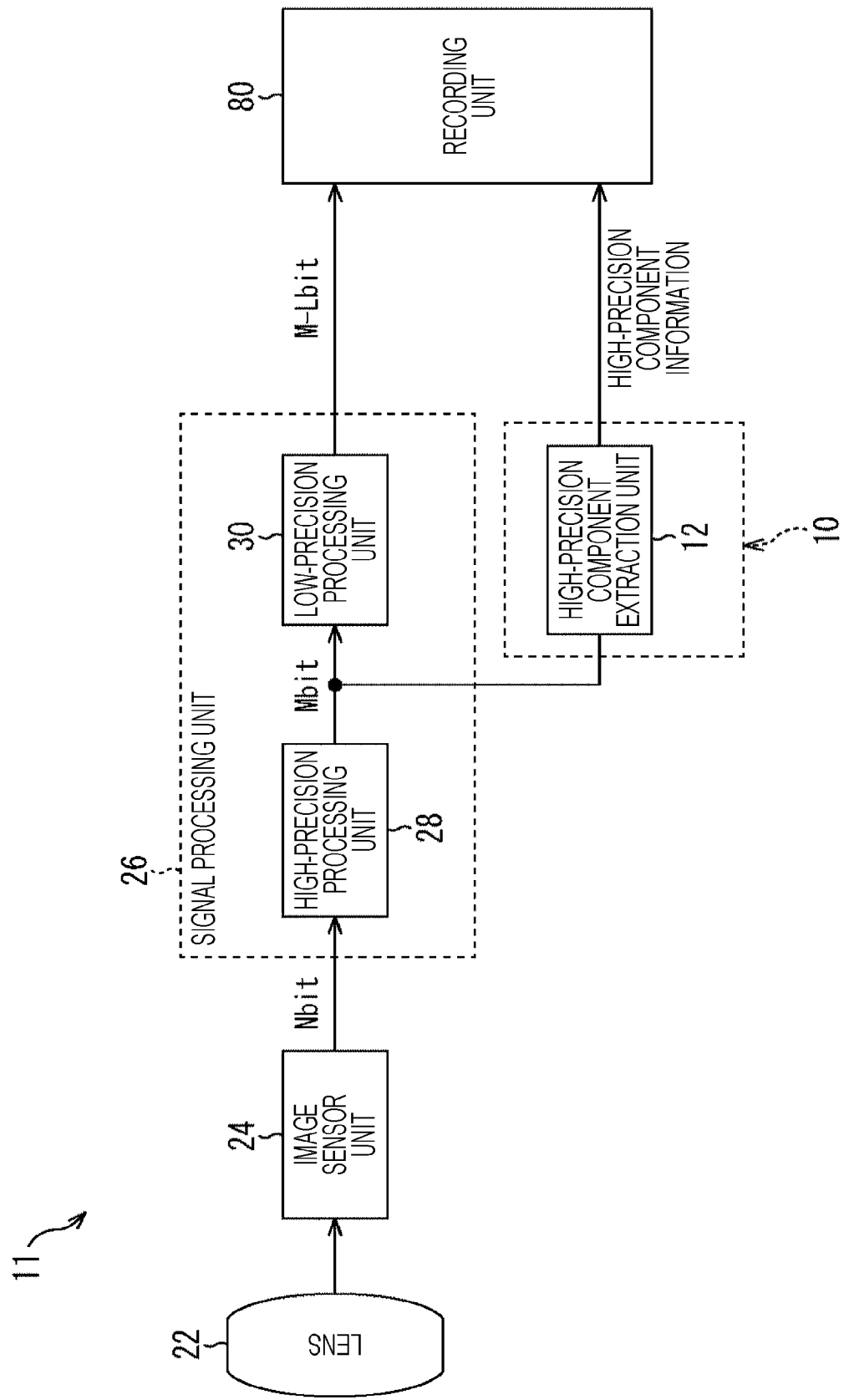
FIG. 27 is a block diagram illustrating a fourth configuration example of an imaging device.

FIG. 27 is a block diagram illustrating a fourth configuration example of an imaging device to which the present technology is applied.

Note that, in FIG. 27, parts corresponding to the parts of the imaging device 11 in FIG. 26 are denoted by the same reference signs, and description thereof will be appropriately omitted.

In FIG. 27, the information processing device 10 does not include the quantization precision reproduction unit 14 and includes only the high-precision component extraction unit 12. Then, the M-L bit length processed signal output from the low-precision processing unit 30 and the high-precision component information output from the high-precision component extraction unit 12 are recorded in the recording unit 80. Note that the recording unit 80 may be a component of the information processing device 10.

Note that a greater amount of information can be reduced in a case where the processed signal and the high-precision component information are recorded in the recording unit 80 as in FIG. 27 than in a case where the reproduction signal is recorded as in FIG. 26. Because the amount of information recorded in the recording unit 80 is reduced, it is possible to store information for a long time in the same storage medium.

Figure 28:
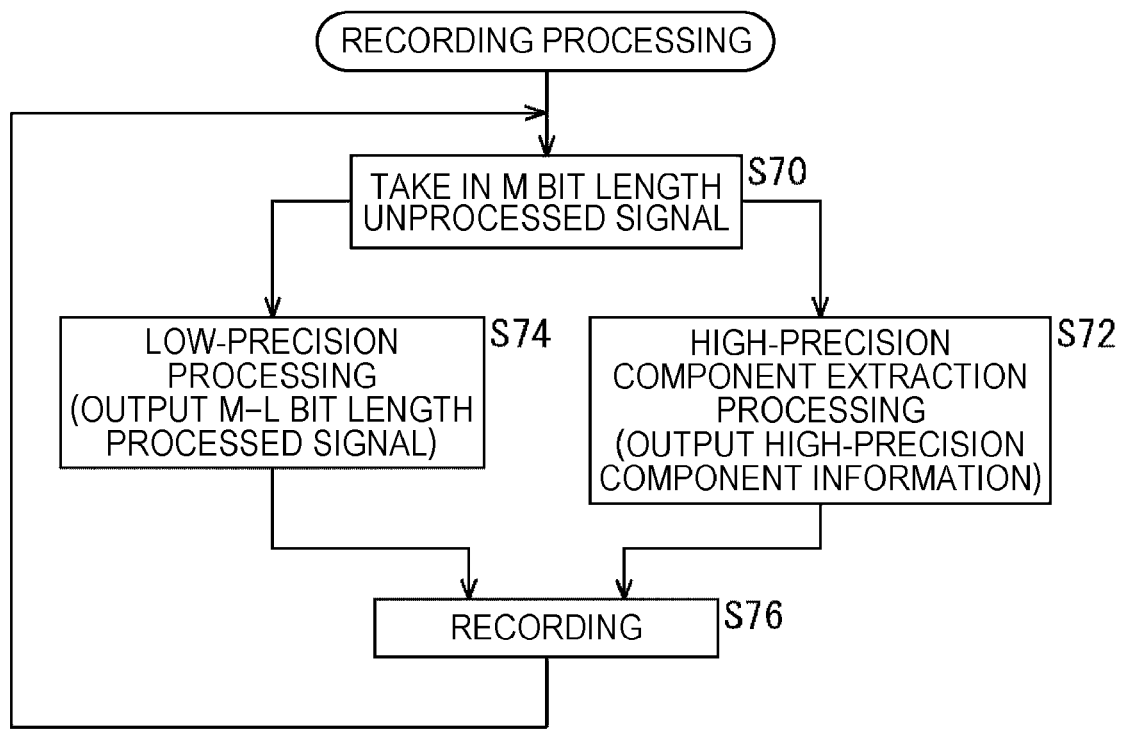
FIG. 28 is a flowchart showing an example of processing performed by an information processing device (including a recording unit) and a low-precision processing unit of FIG. 27.

FIG. 28 is a flowchart showing an example of processing performed by the information processing device 10 and the low-precision processing unit 30 in a case where the recording unit 80 of FIG. 27 is a component of the information processing device 10.

In step S70, the low-precision processing unit 30 and the high-precision component extraction unit 12 take in an M bit length unprocessed signal from the pre-processing unit (e.g., the high-precision processing unit 28 in FIG. 27). The processing proceeds from step S70 to steps S72 and S74.

In step S72, the high-precision component extraction unit 12 extracts high-precision component information from the unprocessed signal taken in in step S70. The high-precision component extraction unit 12 supplies the extracted high-precision component information to the recording unit 80. The processing proceeds from step S72 to step S76.

Meanwhile, in step S74, the low-precision processing unit 30 performs predetermined signal processing on the unprocessed signal taken in in step S70 and supplies an M-L bit length processed signal to the recording unit 80. The processing proceeds from step S74 to step S76.

In step S76, the recording unit 80 records the high-precision component information supplied from the high-precision component extraction unit 12 in step S72 and the M-L bit length processed signal supplied from the low-precision processing unit 2 in step S44 on the recording medium while associating the high-precision component information with the M-L bit length processed signal. The processing returns from step S76 to step S70, and the processing in steps S70 to S76 is repeated.

<< Configuration Example of Reproduction device>>

Figure 29:
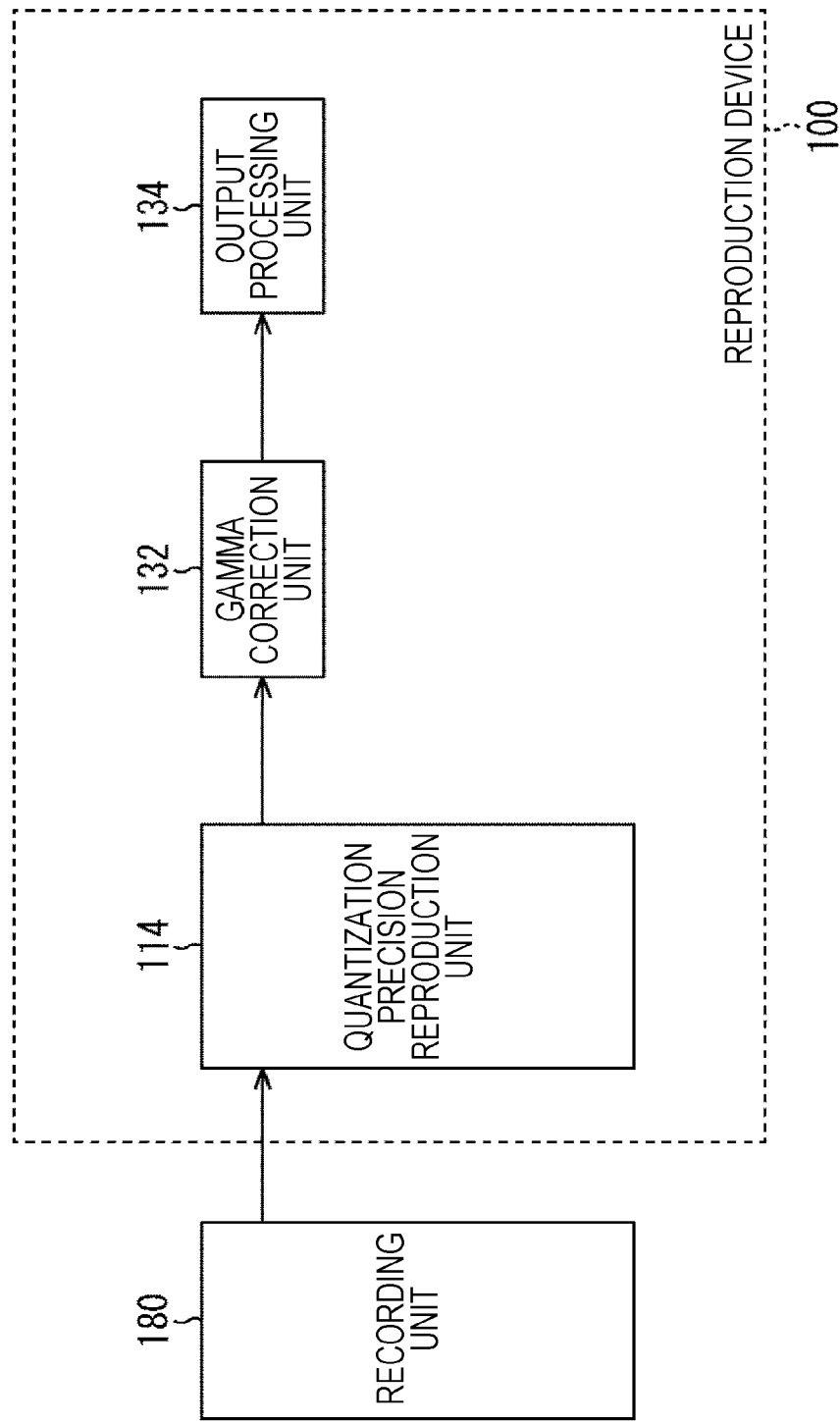
FIG. 29 is a block diagram illustrating a configuration example of a reproduction device.

FIG. 29 is a block diagram illustrating a configuration example of a reproduction device to which the present technology is applied.

A reproduction device 100 includes a quantization precision reproduction unit 114, a gamma correction unit 132, and an output processing unit 134. The quantization precision reproduction unit 114, the gamma correction unit 132, and the output processing unit 134 perform similar processing to that of the quantization precision reproduction unit 14, the gamma correction unit 32, and the output processing unit 34 of FIG. 5, respectively.

In FIG. 29, an M-L bit length processed signal and high-precision component information are recorded in the recording unit 180 as well as in the recording unit 80 of FIG. 27.

The quantization precision reproduction unit 114 reads the M-L bit length processed signal and the high-precision component information recorded in the recording unit 180. Then, the quantization precision reproduction unit 114 reproduces the quantization precision of the M-L bit length processed signal to an M bit length on the basis of the high-precision component information and supplies an M bit length reproduction signal to the gamma correction unit 132.

The configurations of FIGS. 27 and 29 can be employed in the information processing device 10.

Further, the reproduction device 100 of FIG. 29 can be provided in the imaging device 11 of FIG. 27.

Figure 30:
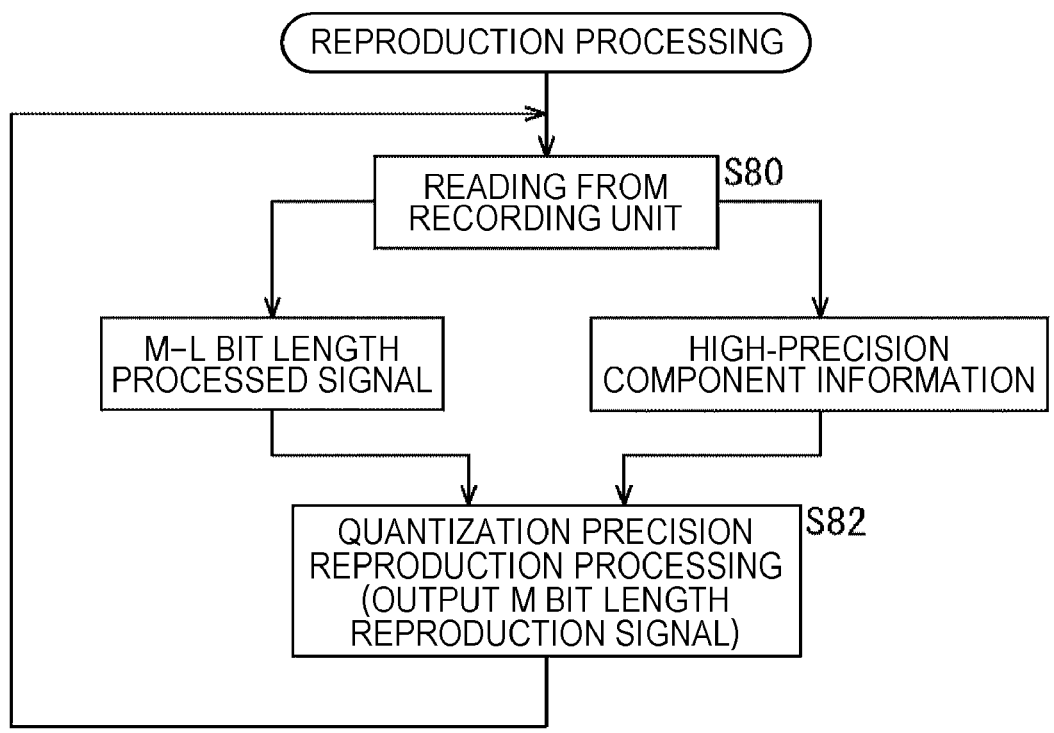
FIG. 30 is a flowchart showing an example of processing performed by a quantization precision reproduction unit of FIG. 29.

FIG. 30 is a flowchart showing an example of processing performed by the quantization precision reproduction unit 114 of FIG. 29.

In step S80, the quantization precision reproduction unit 114 reads an M-L bit length processed signal and high-precision component information recorded in the recording unit 180. The processing proceeds from step S80 to step S82.

In step S82, the quantization precision reproduction unit 114 generates a reproduction signal in which the quantization precision of the M-L bit length processed signal read from the recording unit 180 in step S80 is reproduced (restored) to the M bit length on the basis of the high-precision component information read from the recording unit 180 in step S80. Then, the quantization precision reproduction unit 114 supplies the generated M bit length reproduction signal to the post-processing unit (e.g., the gamma correction unit 132 in FIG. 29). Thereafter, the processing returns to step S80, and the processing in steps S80 and S82 is repeated.

<Other Embodiments>

The present technology is applicable to all information processing devices and information processing methods that process image signals, audio signals, measurement signals, and the like.

<Program>

Further, part of or the entire series of processing of the information processing device 10, the high-precision component extraction unit 12, and the quantization precision reproduction unit 14 in FIG. 1 and the quantization precision reproduction unit 114 in FIG. 29 can be executed by hardware or software. In a case where the series of processing is executed by software, a program forming the software is installed in a computer. Herein, examples of the computer include a computer built in dedicated hardware, a general-purpose personal computer that can execute various functions by installing various programs, and the like.

FIG. 31 is a block diagram illustrating a configuration example of hardware of a computer that executes the series of processing described above by a program. A central processing unit (CPU) 201, a read only memory (ROM) 202, a random access memory (RAM) 203, and a bus 204 are connected to each other in the computer.

The bus 204 is further connected to an input/output interface 205. The input/output interface 205 is connected to an input unit 206, an output unit 207, a storage unit 208, a communication unit 209, and a drive 210.

The input unit 206 includes a keyboard, mouse, microphone, and the like. The output unit 207 includes a display, speaker, and the like. The storage unit 208 includes a hard disk, nonvolatile memory, and the like. The communication unit 209 includes a network interface and the like. The drive 210 drives a removable medium 211 such as a magnetic disk, optical disk, magneto-optical disk, or semiconductor memory.

In the computer configured as described above, the series of processing described above is performed by, for example, the CPU 201 loading a program stored in the storage unit 208 into the RAM 203 via the input/output interface 205 and the bus 204 and executing the program.

The program executed by the computer (CPU 201) can be provided by, for example, being recorded on the removable medium 211 as a package medium or the like. Further, the program can be provided via a wired or wireless transmission medium such as a local area network, the Internet, or digital satellite broadcasting.

In the computer, the program can be installed in the storage unit 208 via the input/output interface 205 by attaching the removable medium 211 to the drive 210. Further, the program can also be installed in the storage unit 208 by being received by the communication unit 209 via the wired or wireless transmission medium. Further, the program can be installed in the ROM 202 or the storage unit 208 in advance.

Note that the program executed by the computer may be a program in which the processing is performed in time series in the order described in the present specification, or may be a program in which the processing is performed in parallel or at a necessary timing such as when a call is made.

Note that the present technology can also have the following configurations.

<1> An information processing device including:
a high-precision component extraction unit that acquires, as an unprocessed signal, a digital signal not subjected to predetermined signal processing and having first quantization precision and extracts, from the unprocessed signal, high-precision component information regarding signal components included in the unprocessed signal; and
a quantization precision reproduction unit that acquires, as a processed signal, a digital signal obtained by performing the predetermined signal processing on the unprocessed signal and having second quantization precision reduced from the first quantization precision and generates a reproduction signal in which the quantization precision of the processed signal is reproduced to the first quantization precision on the basis of the high-precision component information extracted by the high-precision component extraction unit.

<2> The information processing device according to <1>, in which
the high-precision component extraction unit extracts high-frequency components of the unprocessed signal as the high-precision component information, and
the quantization precision reproduction unit includes
a low-frequency component extraction unit that extracts low-frequency components of the processed signal as a precision reproduction signal, and
a blending unit that combines the precision reproduction signal extracted by the low-frequency component extraction unit and the processed signal at a ratio based on the high-frequency components extracted by the high-precision component extraction unit to generate the reproduction signal.

<3> The information processing device according to <1>, in which
the high-precision component extraction unit generates the digital signal having the second quantization precision from the unprocessed signal as a reference signal and extracts a ratio of a difference between the unprocessed signal and the reference signal to the reference signal as the high-precision component, and
the quantization precision reproduction unit combines a high-precision signal obtained by multiplying the processed signal by the ratio and the processed signal to generate the reproduction signal.

<4> The information processing device according to any one of <1> to <3>, further including an adjustment unit that adjusts the high-precision component information extracted by the high-precision component extraction unit.

<5> The information processing device according to any one of <1> to <4>, further including a noise reduction unit that removes noise from the unprocessed signal acquired by the high-precision component extraction unit.

<6> The information processing device according to any one of <1> to <5>, further including a low-precision processing unit that performs the predetermined signal processing on the digital signal having the first quantization precision.

<7> An imaging device including:
an image sensor unit that photoelectrically converts an optical image of a subject and outputs a digital signal of an image signal indicating the optical image;
a high-precision component extraction unit that acquires, as an unprocessed signal, the digital signal output from the image sensor unit, not subjected to predetermined signal processing, and having first quantization precision and extracts, from the unprocessed signal, high-precision component information regarding signal components included in the unprocessed signal; and
a quantization precision reproduction unit that acquires, as a processed signal, a digital signal obtained by performing the predetermined signal processing on the unprocessed signal and having second quantization precision reduced from the first quantization precision and generates a reproduction signal in which the quantization precision of the processed signal is reproduced to the first quantization precision on the basis of the high-precision component information extracted by the high-precision component extraction unit.

<8> An information processing method, in which
an information processing device includes
a high-precision component extraction unit, and
a recording unit,
the high-precision component extraction unit acquires, as an unprocessed signal, a digital signal not subjected to predetermined signal processing and having first quantization precision and extracts, from the unprocessed signal, high-precision component information regarding signal components included in the unprocessed signal, and
the recording unit records, as a processed signal, a digital signal obtained by performing the predetermined signal processing on the unprocessed signal and having second quantization precision reduced from the first quantization precision and also records the high-precision component information extracted by the high-precision component extraction unit.

<9> An information processing device including:
a quantization precision reproduction unit that, on the basis of high-precision component information regarding signal components included in an unprocessed signal that is an M bit length digital signal not subjected to predetermined signal processing, a processed signal that is an M-L bit length digital signal obtained by performing the predetermined signal processing on the unprocessed signal, and an M bit length high-precision digital signal generated from the processed signal, generates a reproduction signal that is an M bit length digital signal in which quantization precision of the processed signal is reproduced to an M bit length.

<10> The information processing device according to <9>, in which the high-precision digital signal is low-frequency components of the processed signal.

<11> The information processing device according to <9> or <10>, in which the high-precision component information indicates high-frequency components of the unprocessed signal.

<12> The information processing device according to <9>, in which the high-precision digital signal is an M bit length high-precision signal generated on the basis of the processed signal and the high-precision component information.

<13> The information processing device according to <12>, in which the high-precision component information indicates a ratio of a difference between the unprocessed signal and a reference signal to the reference signal, the reference signal serving as the M-L bit length digital signal generated from the unprocessed signal.

<14> The information processing device according to <11>, in which the quantization precision reproduction unit combines the high-precision digital signal and the processed signal at a ratio based on the high-frequency components of the unprocessed signal to generate the reproduction signal.

<15> The information processing device according to any one of <9> to <14>, further including a high-precision component extraction unit that extracts the high-precision component information from the unprocessed signal.

<16> The information processing device according to any one of <9> to <15>, further including a processing unit that generates the high-precision digital signal from the processed signal.

<17> The information processing device according to any one of <9> to <16>, further including a low-precision processing unit that performs the predetermined signal processing on the M bit length unprocessed signal to generate the M-L bit length processed signal.

<18> An information processing method, in which an information processing device includes
a quantization precision reproduction unit, and
on the basis of high-precision component information regarding signal components included in an unprocessed signal that is an M bit length digital signal not subjected to predetermined signal processing, a processed signal that is an M-L bit length digital signal obtained by performing the predetermined signal processing on the unprocessed signal, and an M bit length high-precision digital signal generated from the processed signal, the quantization precision reproduction unit generates a reproduction signal that is an M bit length digital signal in which quantization precision of the processed signal is reproduced to an M bit length.

REFERENCE SIGNS LIST

2 Low-precision processing unit
10 Information processing device
11 Imaging device
12 High-precision component extraction unit
13 Adjustment unit
14, 114 Quantization precision reproduction unit
18 Low-precision processing unit
20 Imaging device
22 Lens
24 Image sensor unit
26 Signal processing unit
28 High-precision processing unit
30 Low-precision processing unit
32, 132 Gamma correction unit
34, 134 Output processing unit
40 High-frequency component extraction unit
42 Low-frequency component extraction unit
44 α blending unit
50 Rounding unit
52 Subtraction unit
54 Division unit
56 Multiplication unit
58 Adjustment processing unit
60 Addition unit
70 Noise reduction unit
80 Recording unit
100 Reproduction device
180 Recording unit

The invention claimed is:

1. An information processing device comprising:
circuitry configured to function as:
a high-precision component extraction unit that:
acquires, as an unprocessed signal, a digital signal not subjected to predetermined signal processing and having a first quantization precision, and
extracts, from the unprocessed signal, high-precision component information regarding signal components included in the unprocessed signal; and
a quantization precision reproduction unit that:
acquires, as a processed signal, a digital signal obtained by performing the predetermined signal processing on the unprocessed signal and having a second quantization precision reduced from the first quantization precision, and
generates a reproduction signal in which the quantization precision of the processed signal is reproduced to the first quantization precision on a basis of the high-precision component information without using the unprocessed signal as a direct input to the generation of the reproduction signal.

2. The information processing device according to claim 1, wherein the high-precision component extraction unit extracts high-frequency components of the unprocessed signal as the high-precision component information, and
the quantization precision reproduction unit includes:
a low-frequency component extraction unit that extracts low-frequency components of the processed signal as a precision reproduction signal, and
a blending unit that combines the precision reproduction signal extracted by the low-frequency component extraction unit and the processed signal at a ratio based on the high-frequency components extracted by the high-precision component extraction unit to generate the reproduction signal.

3. The information processing device according to claim 1, wherein the high-precision component extraction unit generates the digital signal having the second quantization precision from the unprocessed signal as a reference signal and extracts a ratio of a difference between the unprocessed signal and the reference signal to the reference signal as the high-precision component information, and the quantization precision reproduction unit combines a high-precision signal obtained by multiplying the processed signal by the ratio and the processed signal to generate the reproduction signal.

4. The information processing device according to claim 1, wherein the circuitry is further configured to function as an adjustment unit that adjusts the high-precision component information extracted by the high-precision component extraction unit.

5. The information processing device according to claim 1, wherein the circuitry is further configured to function as a noise reduction unit that removes noise from the unprocessed signal acquired by the high-precision component extraction unit.

6. A device comprising:
the information processing device according to claim 1, and
further circuitry configured to function as a low-precision processing unit that performs the predetermined signal processing on the digital signal having the first quantization precision so as to generate the processed signal.

7. An imaging device comprising:
an image sensor that photoelectrically converts an optical image of a subject and outputs a digital signal of an image signal indicating the optical image; and
circuitry configured to function as:
a high-precision component extraction unit that:
acquires, as an unprocessed signal, the digital signal output from the image sensor, not subjected to predetermined signal processing, and having a first quantization precision, and
extracts, from the unprocessed signal, high-precision component information regarding signal components included in the unprocessed signal; and
a quantization precision reproduction unit that:
acquires, as a processed signal, a digital signal obtained by performing the predetermined signal processing on the unprocessed signal and having a second quantization precision reduced from the first quantization precision, and
generates a reproduction signal in which the quantization precision of the processed signal is reproduced to the first quantization precision on a basis of the high-precision component information without using the unprocessed signal as a direct input to the generation of the reproduction signal.

8. An information processing method, comprising:
acquiring, as an unprocessed signal, a digital signal not subjected to predetermined signal processing and having a first quantization precision;
extracting, from the unprocessed signal, high-precision component information regarding signal components included in the unprocessed signal;
recording, as a processed signal, a digital signal obtained by performing the predetermined signal processing on the unprocessed signal and having a second quantization precision reduced from the first quantization precision; and
recording the high-precision component information, wherein
a reproduction signal in which the quantization precision of the processed signal is reproduced to the first quantization precision is generatable on a basis of the recorded high-precision component information without using the unprocessed signal as a direct input to the generation of the reproduction signal.

9. An information processing device comprising circuitry configured to:
generate, on a basis of:
high-precision component information regarding signal components included in an unprocessed signal that is an M bit length digital signal not subjected to predetermined signal processing,
a processed signal that is an M-L bit length digital signal obtained by performing the predetermined signal processing on the unprocessed signal, and
a high-precision digital signal generated from the processed signal,
a reproduction signal that is an M bit length digital signal in which a quantization precision of the processed signal is reproduced to an M bit length without using the unprocessed signal as a direct input to the generation of the reproduction signal.

10. The information processing device according to claim 9, wherein the high-precision digital signal includes low-frequency components of the processed signal.

11. The information processing device according to claim 10, wherein the high-precision component information indicates high-frequency components of the unprocessed signal.

12. The information processing device according to claim 9, wherein the high-precision digital signal is an M bit length high-precision signal generated on a basis of the processed signal and the high-precision component information.

13. The information processing device according to claim 12, wherein
the high-precision component information indicates a ratio of a difference between the unprocessed signal and a reference signal to the reference signal, and
the reference signal serves as the M-L bit length digital signal generated from the unprocessed signal.

14. The information processing device according to claim 11, wherein the circuitry is configured to combine the high-precision digital signal and the processed signal at a ratio based on the high-frequency components of the unprocessed signal to generate the reproduction signal.

15. The information processing device according to claim 9, the circuitry is configured to extract the high-precision component information from the unprocessed signal.

16. The information processing device according to claim 9, wherein the circuitry is configured to generate the high-precision digital signal from the processed signal.

17. A device comprising:
the information processing device according to claim 9, and
further circuitry configured to perform the predetermined signal processing on the unprocessed signal to generate processed signal.

18. An information processing method, comprising generating, on a basis of:
high-precision component information regarding signal components included in an unprocessed signal that is an M bit length digital signal not subjected to predetermined signal processing,
a processed signal that is an M-L bit length digital signal obtained by performing the predetermined signal processing on the unprocessed signal, and
a high-precision digital signal generated from the processed signal,
a reproduction signal that is an M bit length digital signal in which a quantization precision of the processed signal is reproduced to an M bit length without using the unprocessed signal as a direct input to the generation of the reproduction signal.

\* \* \* \* \*